(12) United States Patent
McLaury et al.

(10) Patent No.: US 10,417,078 B2
(45) Date of Patent: Sep. 17, 2019

(54) DETERMINISTIC READ BACK AND ERROR DETECTION FOR PROGRAMMABLE LOGIC DEVICES

(71) Applicant: Lattice Semiconductor Corporation, Portland, OR (US)

(72) Inventors: Loren McLaury, Hillsboro, OR (US); Brad Sharpe-Geisler, San Jose, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 143 days.

(21) Appl. No.: 15/482,654

(22) Filed: Apr. 7, 2017

(65) Prior Publication Data

US 2017/0293518 A1 Oct. 12, 2017

Related U.S. Application Data

(60) Provisional application No. 62/320,442, filed on Apr. 8, 2016.

(51) Int. Cl.
*G06F 11/00* (2006.01)
*G06F 11/07* (2006.01)
*G11C 11/419* (2006.01)
*H03K 19/177* (2006.01)
*G11C 29/52* (2006.01)

(52) U.S. Cl.
CPC .......... *G06F 11/079* (2013.01); *G06F 11/073* (2013.01); *G06F 11/0751* (2013.01); *G06F 11/0769* (2013.01); *G11C 11/419* (2013.01); *G11C 29/52* (2013.01); *H03K 19/1776* (2013.01); *H03K 19/17728* (2013.01)

(58) Field of Classification Search
CPC .............................. G06F 11/073; G06F 11/079
See application file for complete search history.

(56) References Cited

U.S. PATENT DOCUMENTS

| | | | |
|---|---|---|---|
| 6,057,704 A * | 5/2000 | New | H03K 19/17704 326/38 |
| 6,553,523 B1 * | 4/2003 | Lindholm | G01R 31/318516 326/38 |
| 7,167,404 B2 * | 1/2007 | Pathak | G01R 31/318516 365/201 |
| 7,257,750 B1 * | 8/2007 | Singh | G11C 29/42 714/732 |
| 8,065,574 B1 | 11/2011 | Cheng et al. | |

(Continued)

*Primary Examiner* — Christopher S McCarthy
(74) *Attorney, Agent, or Firm* — Haynes and Boone, LLP

(57) ABSTRACT

Various techniques are provided to efficiently implement deterministic read back and error detection for programmable logic devices (PLDs). In one example, a PLD includes an array of memory cells arranged in rows and columns, where at least one row includes an enable bit. The PLD further includes an address logic circuit configured to selectively assert the columns of the array by respective address lines. The PLD further includes a register configured to store a value of the enable bit in response to an assertion of an address line corresponding to the enable bit. The PLD further includes a read back circuit configured to selectively provide, for each memory cell, a data bit value stored by the memory cell or a predetermined data bit value based at least on the stored value of the register. Additional systems and related methods are provided.

18 Claims, 7 Drawing Sheets

(56) References Cited

U.S. PATENT DOCUMENTS

| | | | | |
|---|---|---|---|---|
| 8,522,126 B1* | 8/2013 | Chen | .................... | G06F 11/004 |
| | | | | 714/763 |
| 2006/0120141 A1* | 6/2006 | Khurana | .............. | G11C 7/1051 |
| | | | | 365/154 |
| 2014/0208156 A1* | 7/2014 | Muralimanohar | ....... | G11C 8/12 |
| | | | | 714/6.24 |

* cited by examiner

DETERMINISTIC READ BACK AND ERROR DETECTION FOR PROGRAMMABLE LOGIC DEVICES

CROSS-REFERENCE TO RELATED APPLICATION

This patent application claims priority to and the benefit of U.S. Provisional Patent Application No. 62/320,442 filed Apr. 8, 2016 and entitled "DETERMINISTIC SINGLE-EVENT DETECTION" which is hereby incorporated by reference in its entirety.

TECHNICAL FIELD

The present invention relates generally to programmable logic devices and, more particularly, to facilitating deterministic read back and error detection for programmable logic devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

The generated configuration data (also referred to as original configuration data) is loaded into configuration memory of the PLDs to implement the programmable logic gates, LUTs, embedded hardware, and/or other types of configurable resources. The configuration memory of the PLDs may be volatile memory, such as random access memory (RAM). Once the configuration data is loaded into the PLDs, the configuration memory is essentially read-only memory that cannot be changed by the user.

Some of the configuration memory is allocated for distributed RAM (also known as non-configuration memory or distributed memory). After the PLD is configured, the portions of the configuration memory allocated for distributed RAM are usable for storing non-configuration data, such as user data. In this regard, the distributed RAM includes memory cells that may be used to store non-configuration data during operation of the PLD.

However, the configuration data in the configuration memory, like other types of memory, can suffer from soft errors. In this regard, even though the memory can be constructed correctly, events such as cosmic rays, alpha particle absorption, and/or other types of radiation can change a bit value stored in a memory cell, which may be referred to as a soft error. In some cases, the configuration data stored in the configuration memory can be repeatedly retrieved (e.g., read out) and compared to the original configuration data to facilitate detection of soft error events during device operation. However, when some of the configuration memory is used as distributed RAM for storing non-configuration data (e.g., user data), values stored by the distributed RAM are not predetermined by the original configuration data. As a result, the non-configuration data values may be incorrectly identified as errors when read out with the remaining configuration data and compared with the original configuration data (e.g., and/or through a cyclic redundancy check (CRC) or parity check).

Conventional approaches for facilitating compatibility between allocating distributed RAM and performing error detection generally require additional circuitry for each potential distributed RAM cell. In these approaches, additional circuitry are employed for each of these memory cells to block/prevent read out of these memory cells, e.g. during error detection. Often times the additional circuitry may require three or more transistors to be provided for each memory cell. In a conventional six transistor static RAM (SRAM) cell, the additional circuitry increases the overall transistor count and corresponding device area by at least 50% per memory cell. Therefore, there is a need to provide improved ways to facilitate deterministic read back and error detection for PLDs with potential distributed RAM.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
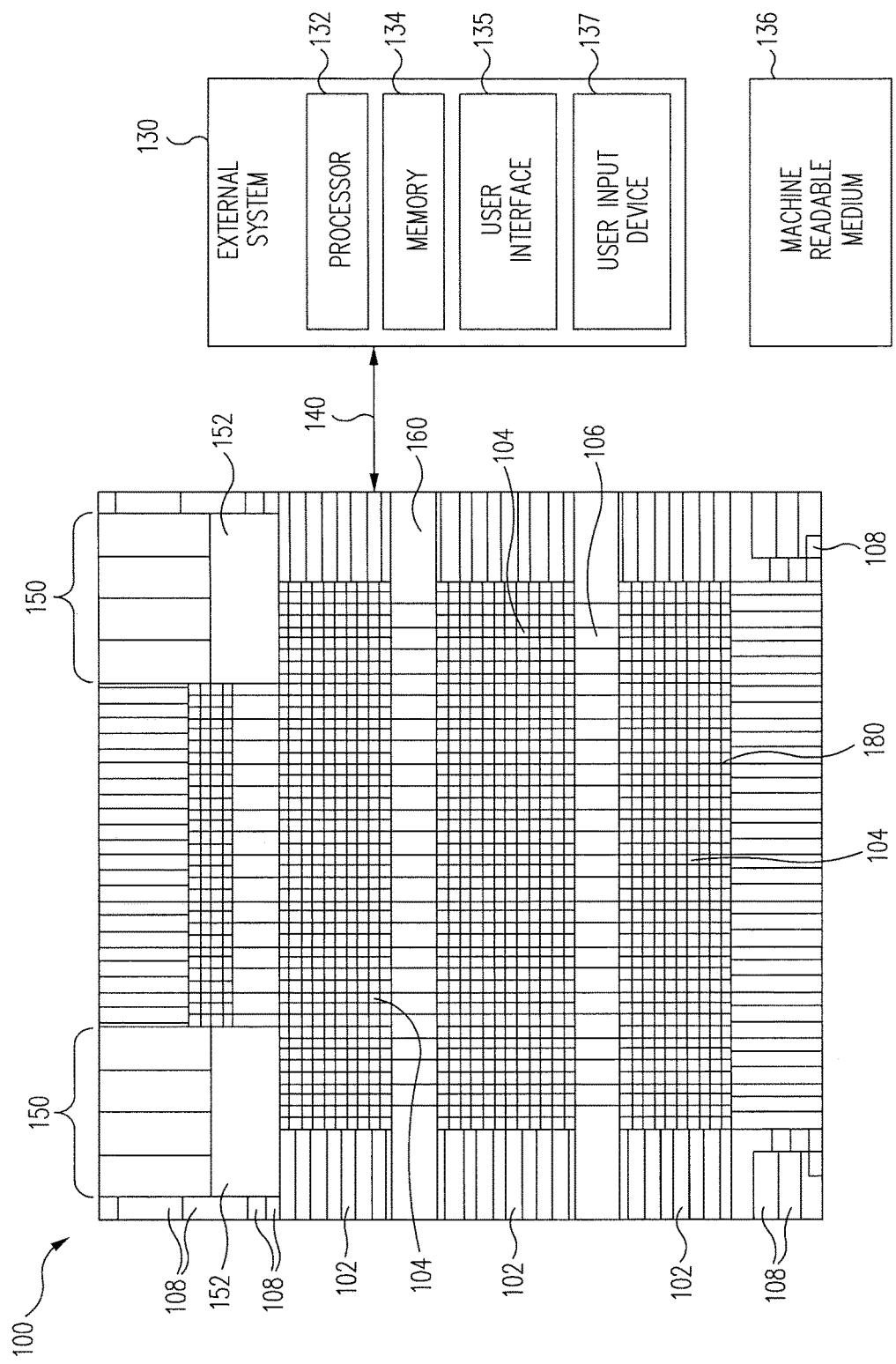
FIG. 1 illustrates a block diagram of a PLD in accordance with an embodiment of the disclosure.

Various techniques are provided to facilitate deterministic read back and error detection for PLDs. In this regard, the deterministic read back may allow allocation of the PLDs' configuration memory to be used as distributed RAM (also referred to as non-configuration memory or distributed memory), which does not contain predetermined data, while maintaining compatibility of the PLDs with error detection. In particular, a predetermined data value may be read out for all memory cells of a row without requiring deterministic read back circuitry to be implemented on a cell-by-cell basis, thus reducing implementation costs.

In an embodiment, a PLD includes configuration memory that includes an array of memory cells arranged in rows and columns, in which at least one row of the array includes a distributed RAM enable bit memory cell that stores a distributed RAM enable bit (also referred to as a pilot bit or an enable bit) included in the configuration data loaded into the PLD. The memory cells may be volatile memory cells (e.g., RAM cells, such as SRAM cells). In addition to the enable bit memory cell, the array may include configuration memory cells usable to store configuration data (e.g., usable exclusively for storing configuration data) and potential distributed RAM cells. In this regard, the state of the enable bit is included in the original configuration data. Although the present disclosure generally refers to various operations performed on rows and/or columns, rows may be used as columns and columns may be used as rows as appropriate.

In some embodiments, when the enable bit is asserted (e.g., set to a logic high value), the potential distributed RAM cells are used as distributed RAM cells usable for storing non-configuration data (e.g., user data). When the enable bit is not asserted (e.g., enable bit is set to a logic low value), the potential distributed RAM cells are used as configuration memory cells usable for storing configuration data. Thus, the value of the enable bit (also referred to as its state) determines whether the potential distributed RAM stores data that is predetermined (e.g., configuration data) or not predetermined. In some embodiments, the distributed RAM of the PLD may be provided by memory cells of one or more LUTs of the PLD, as further discussed herein. In an embodiment, as used herein, an asserted signal, such as an asserted enable bit, may be a logic high (e.g., "1") or a logic low (e.g., "0") depending on implementation.

In various embodiments, deterministic read back may be facilitated through the use of the value of the enable bit and a location (e.g., column address) of the enable bit in the array. In some embodiments, the PLD may include an address logic circuit configured to selectively assert (e.g., select) the columns of the array by respective address lines, and a distributed RAM enable bit register configured to store the value of the enable bit in response to an assertion by the address logic circuit of the address line corresponding to an enable bit. In some cases, the address logic circuit may be implemented by or as part of an address shift register (ASR).

The PLD may also include a read back circuit configured to selectively provide, for each memory cell of the array, a data bit value stored by the memory cell or a predetermined data bit value based at least on the stored value of the distributed RAM enable bit register. In an embodiment, the PLD may include a distributed RAM status bit register configured to identify whether each memory cell accessed by the read back circuit includes non-configuration data. In this embodiment, the read back circuit may selectively provide, for a group of memory cells of the array, the data bit value of the enable bit register temporarily stored in the status bit register.

In an embodiment, when the enable bit is not asserted, the read back circuit may provide the data bit value for each memory cell of the array, since the potential distributed RAM cells (e.g., LUT cells) are used as configuration memory cells. When the enable bit is asserted, the read back circuit may provide the data bit value stored by the configuration memory cells of the array and the predetermined data bit value for the potential distributed RAM cells of the array, since the potential distributed RAM cells are used as distributed RAM cells. In this case, the predetermined data bit value is independent of the data bit value stored by the distributed RAM cells.

In an embodiment, utilization of such additional circuitry for facilitating deterministic read back may reduce the number of components (e.g., transistors) relative to conventional approaches that add/couple additional components to the memory cells (e.g., on a cell-by-cell basis) to block/prevent read out of the memory cells. In some cases, the additional circuitry may be shared by different potential distributed RAM cells of the PLD, thus reducing die space associated with the deterministic read back. The additional circuitry may be shared within a programmable logic block of the PLD, between different programmable logic blocks of the PLD, and/or with generally any other memory of the PLD that may utilize deterministic read back.

Thus, using various embodiments, the configuration data stored by the memory cells of the array can be passed onto data lines for read out (e.g., to an external system for error detection processing) and the non-configuration data are driven to deterministic (e.g., predetermined) data bit values that can be passed onto the data lines for read out. With the deterministic read back, error detection may be performed on the configured PLD to identify errors (also referred to as error events or upsets) attributable to the configuration data.

In an embodiment, the error detection may be, or may be referred to as, a soft error detection (SED) for detection of soft errors in the configuration data stored in the PLD. Soft errors may be due to cosmic rays, alpha particle absorption, and/or other types of radiation that can cause data bit values stored in memory to change (e.g., flip a data bit value from 0 to 1, or vice versa). Since in some cases even a single error event may ruin the configuration (e.g., functionality defined/implemented by the configuration data) of the PLDs, a soft error detection may also be referred to as a single-event detection or single-error detection. In an embodiment, the error detection may be performed by an error detection circuit built in the PLD (e.g., as a built-in self-test (BIST) system) and/or an external error detection circuit coupled to the PLD.

In an embodiment, the error detection may be performed by first calculating an error-detecting code, such as a cyclic redundancy check (CRC) checksum and/or a hash value, based on the configuration data (e.g., original configuration data) to be loaded into the PLD. The original configuration data may be stored in a non-volatile memory embedded in the PLD and/or external to the PLD (e.g., on an external hard drive, or on an external flash device).

After configuration and during operation of the PLD, a corresponding error-detecting code (e.g., CRC checksum and/or hash value) may repeatedly be calculated by retrieving the configuration data stored in the configuration memory and generating the error-detecting code based on the retrieved data. In this regard, the retrieving of the configuration data stored in the configuration memory may be referred to as reading out or reading back the configuration data.

Data bit values stored in memory cells of the distributed RAM may be forced to the predetermined value (e.g., a "0" value) for purposes of computing the error-detecting code. In this regard, the error-detecting code for the original configuration data may be similarly computed with the unused portions set to the predetermined value. For instance, the error-detecting code may consider each empty memory cell (e.g., the unused memory cells of the configuration memory) to be at the predetermined value for purposes of computing the error-detecting code.

During normal operation of the PLD, data stored in the distributed RAM cells may be accessible to the user via a programmable logic fabric, and written and rewritten/overwritten as needed by the user. Since values stored in the distributed RAM are not pre-determined, read back of values of the configuration memory, which include values of the distributed RAM, generally cause the error-detecting code computed from the read back values to differ from that computed from the original configuration memory.

Thus, in an embodiment, with the deterministic read back, a mismatch/difference between the error-detecting code computed based on the read back values from the configured PLD and the error-detecting code computed based on the original configuration data is generally indicative of presence of an error(s) attributable to the configuration data stored by the array. Upon detection of the corrupted configuration data, the PLD may receive instructions (e.g., hardware or software instructions) to load the original configuration memory (e.g., from the non-volatile memory) into the PLD, or to make a correction based on error-correcting code (ECC) (e.g., in some embodiments, ECC may be used to fix one error per field).

In an embodiment, write operations may be performed on distributed RAM cells while error detection (e.g., SED) is being performed. In an embodiment, a write circuit may be provided for potential distributed RAM cells (e.g., LUT cells) such that, when these memory cells are used as distributed RAM cells (e.g., the enable bit is asserted), the write circuit can be utilized by the user to access and write non-configuration data (e.g., user data) to the distributed RAM cells concurrent with read back being performed on the potential distributed RAM cells. In some cases, the write functionality may be provided via differential write drivers that provide respective signals to differential bitlines. The write functionality may be synchronously driven, such as being triggered off of a local clock in a programmable logic block. This is in general asynchronous with SED read. In some cases, to improve the write performance during SED read, the differential bitlines can be pre-charged using a pre-charge circuit. The pre-charge circuit may be driven based on the stored value of the enable bit register and/or the status bit register.

Referring now to the drawings, FIG. 1 illustrates a block diagram of a PLD 100 in accordance with an embodiment of the disclosure. The PLD 100 (e.g., an FPGA, a CPLD, an FPSC, or other type of programmable device) generally includes input/output (I/O) blocks 102 and programmable logic blocks (PLBs) 104. In an embodiment, the programmable logic blocks 104 may also be referred to as logic blocks or programmable functional units (PFUs). Each programmable logic block 104 may include an array of memory cells arranged in columns and rows. In an embodiment, the array may include a enable bit memory cell, configuration memory cells, and potential distributed RAM cells.

The I/O blocks 102 provide I/O functionality (e.g., to support one or more I/O and/or memory interface standards) for the PLD 100, while the programmable logic blocks 104 provide logic functionality (e.g., LUT-based logic) for the PLD 100. Additional I/O functionality may be provided by serializer/deserializer (SERDES) blocks 150 and physical coding sublayer (PCS) blocks 152. The PLD 100 may also include hard intellectual property core (IP) blocks 160 to provide additional functionality (e.g., substantially predetermined functionality provided in hardware which may be configured with less programming than the programmable logic blocks 104).

The PLD 100 may also include blocks of memory 106 (e.g., blocks of erasable programmable read-only memory (EEPROM), block SRAM, and/or flash memory), clock-related circuitry 108 (e.g., clock sources, phase-locked loop (PLL) circuits, and/or delay-locked loop (DLL) circuits), and/or various routing resources 180 (e.g., interconnect and appropriate switching logic to provide paths for routing signals throughout the PLD 100, such as for clock signals, data signals, or others) as appropriate. In general, the various elements of the PLD 100 may be used to perform their intended functions for desired applications, as would be understood by one skilled in the art.

For example, certain of the I/O blocks 102 may be used for programming the memory 106 or transferring information (e.g., various types of user data and/or control signals) to/from the PLD 100. Other of the I/O blocks 102 include a first programming port (which may represent a central processing unit (CPU) port, a peripheral data port, a serial peripheral interface (SPI) interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, the I/O blocks 102 may be included to receive configuration data and commands (e.g., over one or more connections) to configure the PLD 100 for its intended use and to support serial or parallel device configuration and information transfer with the SERDES blocks 150, PCS blocks 152, hard IP blocks 160, and/or programmable logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout the PLD 100, such as in and between the programmable logic blocks 104, hard IP blocks 160, and routing resources 180 to perform their conventional functions (e.g., storing configuration data that configures the PLD 100 or providing interconnect structure within the PLD 100). It should also be understood that the various embodiments disclosed herein are not limited to programmable logic devices, such as the PLD 100, and may be applied to various other types of programmable devices, as would be understood by one skilled in the art.

An external system 130 may be used to create a desired user configuration or design of the PLD 100 and generate corresponding configuration data to program (e.g., configure) the PLD 100. For example, to configure (e.g., program) the PLD 100, the system 130 may provide such configuration data to one or more of the I/O blocks 102, programmable logic blocks 104, SERDES blocks 150, and/or other portions of the PLD 100. As a result, the programmable logic blocks 104, various of the routing resources 180, and any other appropriate components of the PLD 100 may be configured to operate in accordance with user-specified applications.

In the illustrated embodiment, the system 130 is implemented as a computer system. In this regard, the system 130 includes, for example, one or more processors 132 that may be configured to execute instructions, such as software instructions, provided in one or more memories 134 and/or stored in non-transitory form in one or more non-transitory machine readable media 136 (e.g., which may be internal or external to the system 130). For example, in some embodiments, the system 130 may run PLD configuration software, such as Lattice Diamond System Planner software available from Lattice Semiconductor Corporation to permit a user to create a desired configuration and generate corresponding configuration data to program the PLD 100.

In some embodiments, the memory 106 of the PLD 100 may include non-volatile memory (e.g., flash memory)

utilized to store the configuration data generated and provided to the memory 106 by the external system 130. During configuration of the PLD 100, the non-volatile memory may provide the configuration data via configuration paths and associated data lines to configure the various portions (e.g., I/O blocks 102, programmable logic blocks 104, SERDES blocks 150, routing resources 180, and/or other portions) of the PLD 100. In some cases, the configuration data may be stored in non-volatile memory external to the PLD 100 (e.g., on an external hard drive such as the memories 134 in the system 130). During configuration, the configuration data may be provided (e.g., loaded) from the external non-volatile memory into the PLD 100 to configure the PLD 100.

In an embodiment, the system 130 can also be used to send an instruction (e.g., a command) to the PLD 100 to perform read back of the configuration memory and provide the read back values to the system 130. The system 130 may perform error detection based on original configuration data and the read back values provided by the PLD 100. For example, the system 130 may compute an error-detecting code (e.g., CRC checksum) for the original configuration data and for the read back values and determine that an error is present in the read back values when the error-detecting codes do not match. When an error is determined to have occurred, the system 130 may provide the original configuration data to be reloaded into the PLD 100 to reconfigure (e.g., reprogram) the PLD 100 and/or send an instruction to the PLD 100, such as a power-on reset (PoR) command, to cause the PLD 100 to reload the original configuration data (e.g., stored in the memory 106 of the PLD 100).

The system 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of the PLD 100.

Figure 2:
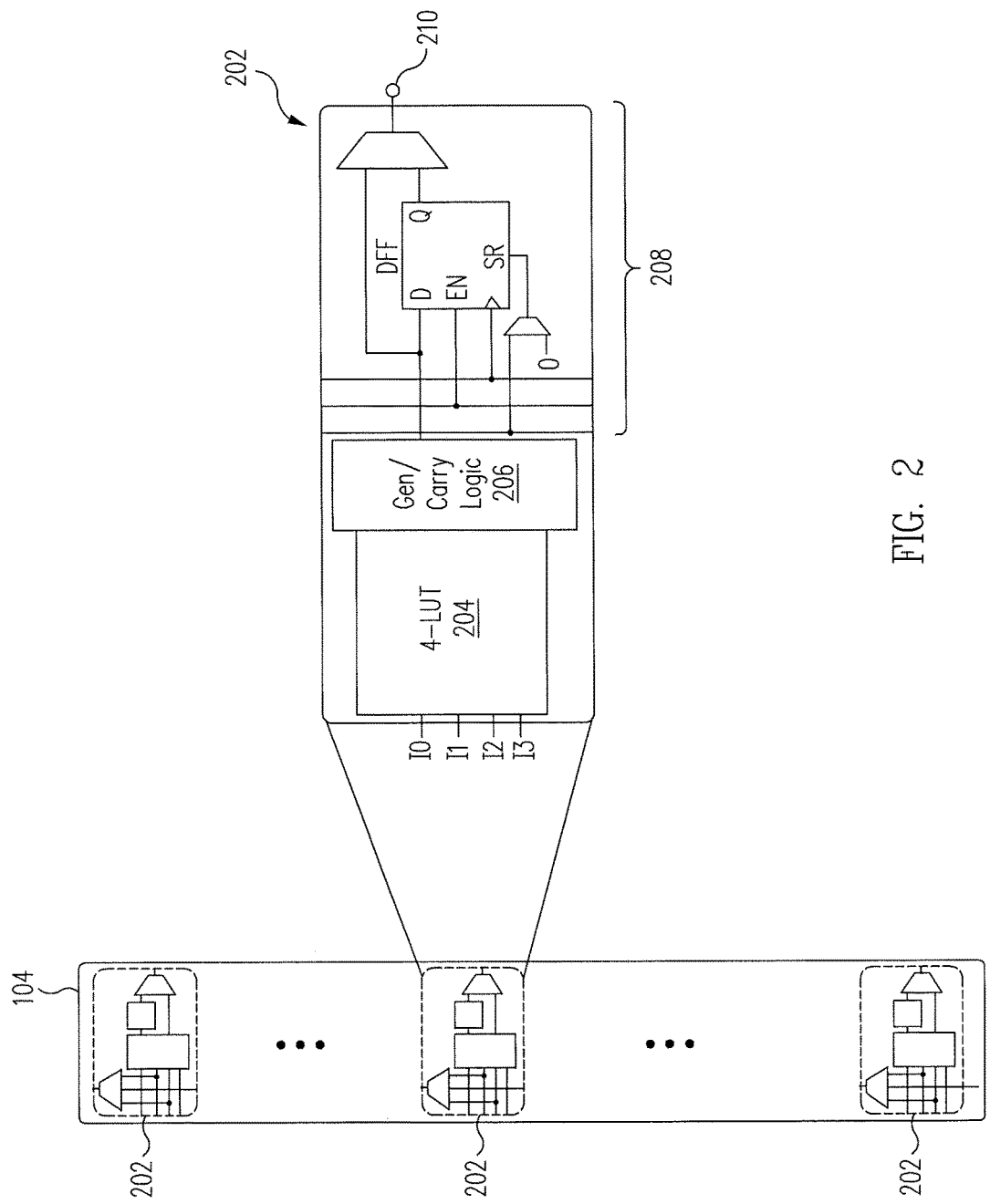
FIG. 2 illustrates a block diagram of a programmable logic block of a PLD in accordance with an embodiment of the disclosure.

FIG. 2 illustrates a block diagram of a programmable logic block 104 of PLD 100 in accordance with an embodiment of the disclosure. The programmable logic block 104 includes programmable logic cells (PLCs) 202. In some cases, the PLCs 202 include various components to provide logic and arithmetic functionality. The PLCs 202 may be interconnected internally within the programmable logic block 104 and/or externally (e.g., to PLCs of other programmable logic blocks) using the routing resources 180. Each PLC 202 may provide logic functions defined/configured by corresponding memory cells of the programmable logic block 104. As one example shown in FIG. 2, one of the PLCs 202 may be implemented as a LUT 204, a generate/carry logic circuit 206, and an output logic 208. The output logic 208 may be implemented, for example, as latches (e.g., registers), programmable multiplexers for selecting desired signal paths within the PLC 202 and/or between the PLCs 202, and/or other components.

In this example, the LUT 204 accepts four inputs $I_0$, $I_1$, $I_2$, and $I_3$, and generates an output signal based at least on the four inputs. Since the LUT 204 accepts four inputs, the LUT 204 is a four-input LUT (which may be abbreviated as "4-LUT" or "LUT 4"). The LUT 204 can be programmed by configuration data for the PLD 100 to implement any appropriate logic operation having four inputs or less. The LUT 204 in other examples may be of any other suitable size having any other suitable number of inputs for a particular implementation of a PLD. In some embodiments, different size LUTs may be provided for different programmable logic blocks 200 and/or different PLCs 202.

The generate/carry logic circuit 206 may be utilized to efficiently implement arithmetic operations such as adders, subtractors, comparators, counters, or other operations, or to efficiently form some wide logic operations (e.g., working on multiple bit data). For example, the generate/carry logic circuits 206 across multiple PLCs 202 may be chained together to pass carry-in signals and carry-out signals between adjacent PLCs 202, e.g. using one or more programmable multiplexers. In some embodiments, the generate/carry logic circuits 206 may be chained across multiple PLCs 202. The generate/carry logic circuit 206 may be implemented to provide a carry value for arithmetic operations or logic operations.

An output signal from the LUT 204 and/or the generate/carry logic circuit 206 may in some embodiments be passed through a multiplexer(s) and/or a register(s) to provide an output signal 210 of the PLC 202. In some embodiments, the configuration data for the PLD 100 may configure the output signal 210 of the PLC 202 to be provided as one or more inputs of another PLC 202 (e.g., in another programmable logic block 104 or the same programmable logic block 104) in a staged or cascaded arrangement (e.g., comprising multiple levels) to configure logic operations that cannot be implemented in a single logic cell 202 (e.g., logic operations that have too many inputs to be implemented by the single LUT 204).

The PLC 202 illustrated in FIG. 2 is merely an example, and the PLCs 202 according to different embodiments may include different combinations and arrangements of PLD components. Also, although FIG. 2 illustrates the programmable logic block 104 having a single column with at least three PLCs 202, the programmable logic block 104 according to other embodiments may include more columns, more or fewer rows, fewer or more PLCs 202, and/or different components in the PLCs 202. Each of the PLCs 202 of the programmable logic block 200 may be used to implement a portion of a user design implemented by the PLD 100. In this regard, the PLD 100 may include many programmable logic blocks 104, each of which may include PLCs 202 and/or other components which are used to collectively implement the user design.

In some embodiments, the distributed RAM of the programmable logic blocks 104 may be provided by memory cells of one or more LUTs 204. For example, in some embodiments, each programmable logic block 104 of PLD 100 has eight LUTs 204, of which some (e.g., 50%) may be designated for use as distributed RAM. In some embodiments, each LUT 204 includes 16 memory cells, which may be used for configuration data only and/or non-configuration data depending on the particular allocation of distributed RAM in PLD 100 (further discussed herein). In some embodiments, each programmable logic block 104 has eight LUTs 204, collectively providing 64 bits of distributed RAM available in each programmable logic block 104.

When the configuration data is generated such that the enable bit is not asserted, upon configuring PLD 100 with this configuration data, the LUT memory of the LUTs 204 is usable for storing LUT data to implement one or more of the LUTs 204. Once the LUT memory is configured (e.g., programmed, loaded with LUT data), the LUT memory is essentially read-only memory.

When the configuration data is set such that the enable bit has an asserted state, upon configuring PLD 100 with this configuration data, the LUT memory of the LUTs 204 is used as distributed RAM for storing non-configuration data rather than storing LUT data to implement the LUTs 204. In this regard, the LUT memory cells are used as distributed RAM cells. A write circuit and a read decode circuit are used to allow non-configuration data (e.g., user data) to be written to or read from the distributed RAM (e.g., by the user) during operation of PLD 100. In some cases, the read decode circuit utilizes decode path circuitry of the LUTs 204. As an example, for programmable logic blocks 104 with four LUTs 204 (e.g., 64 bits) used as distributed RAM, four bits can be read or written at a time.

Figure 3A:
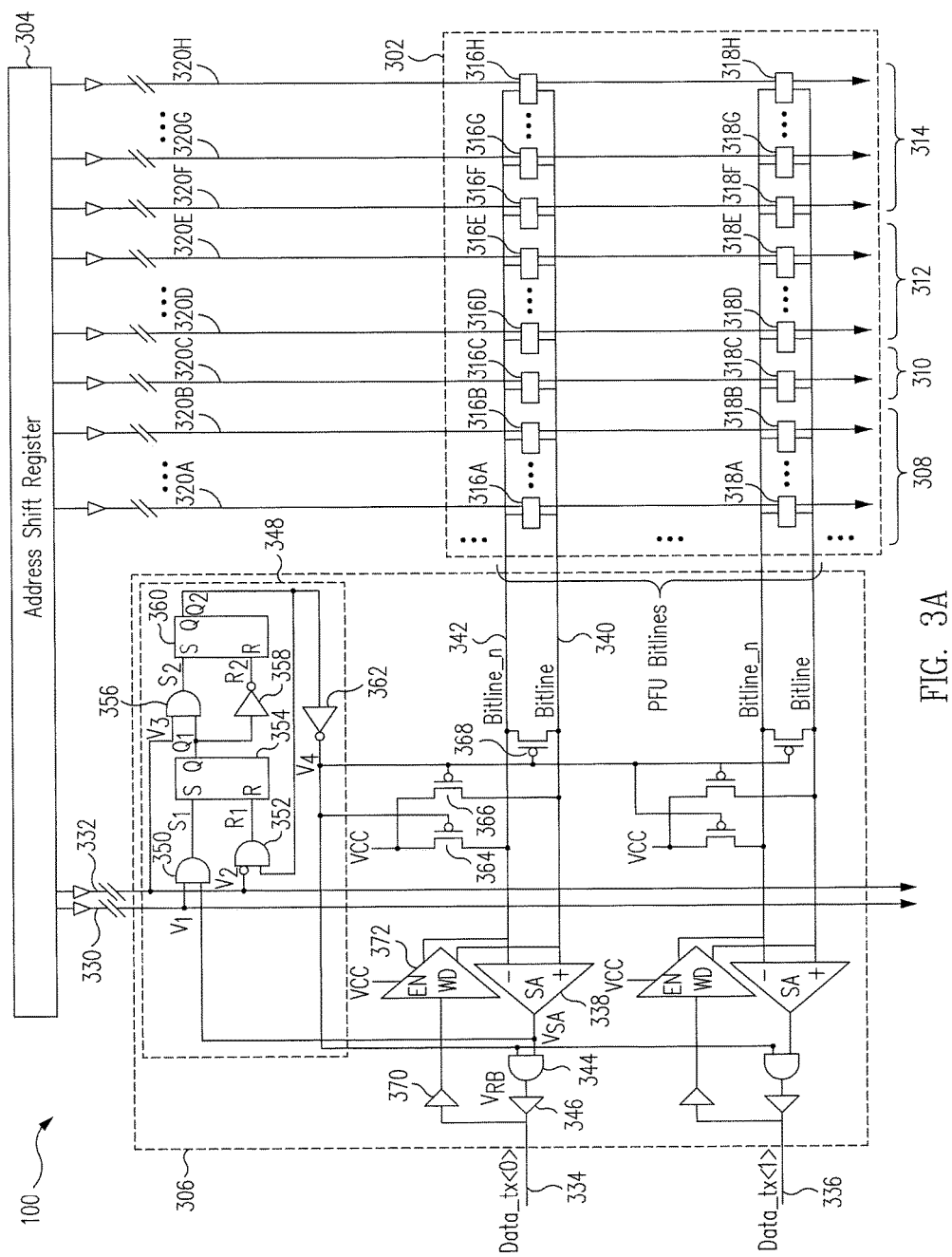
FIG. 3A illustrates a schematic diagram of a portion of a PLD for facilitating deterministic read back and error detection for PLDs in accordance with an embodiment of the disclosure.

FIG. 3A illustrates a schematic diagram of a portion of PLD 100 for facilitating deterministic read back and error detection for PLDs in accordance with an embodiment of the disclosure. The PLD 100 includes a memory cell array 302, an ASR 304, and a read/write circuit 306. The array 302 includes memory cells arranged in columns and rows and associated with a programmable logic block 104. Although FIG. 3A illustrates two rows and seven columns of memory cells, the array 302 may include a different number (e.g., more, fewer) of rows and/or columns than that shown in FIG. 3A. In an embodiment, the memory cells 316A-H may be memory cells used to define/configure logic functions, such as logic functions of one or more LUTs (e.g., one or more LUT4s) and/or other components. Similarly, the memory cells 318A-H may be memory cells used to define/configure logic functions.

In FIG. 3A, the array 302 includes configuration memory columns 308 including memory cells 316A-B and 318A-B, an enable bit column 310 including memory cells 316C and 316D, potential distributed RAM columns 312 including 316D-F and 318D-F, and configuration memory columns 314 including memory cells 316G-H and 318G-H. In an embodiment, the enable bit column 310 includes one memory cell that stores the enable bit. For discussion purposes, the memory cell 316C stores the enable bit. Memory cells in configuration memory columns may be referred to as configuration memory cells. Each of the potential distributed RAM columns 312 may include potential distributed RAM cells along some rows and configuration memory cells along the remaining rows.

The PLD 100 includes address logic implemented, for example, by the ASR 304. Additional and/or related logic can be used to implement the address logic. The ASR 304 may be utilized to selectively assert columns of the array 302 via address lines 320A-H. For example, the ASR 304 may assert address line 320B to facilitate access to the memory cells 316B and 318B (e.g., by the read/write circuit 306). Asserting the address line 320B may be referred to as asserting (e.g., selecting) the configuration memory column that includes the memory cells 316C and 318C. In addition, the ASR 304 may be utilized to selectively assert columns of another programmable logic block (not shown) and/or other memory via additional address lines not shown in FIG. 3A.

The PLD 100 includes data read back logic implemented, for example, by the read/write circuit 306. Additional and/or related logic can be used to implement the data read back logic. For facilitating read back, when a column is asserted by the ASR 304, the read/write circuit 306 provides a read back value on data lines of memory cells on the asserted column. For example, when the address line 320A is asserted by the ASR 304, the read/write circuit 306 provides a read back value associated with the memory cell 316A on the data line 334, a read back value associated with the memory cell 318A on the data line 336, and read back values associated with other memory cells along the same column on respective data lines.

During configuration of the PLD 100, configuration data can be provided as a configuration bitstream that is loaded serially, via data lines, into the array 302, other memory cell arrays (not shown) of the same or different programmable logic blocks, and/or other configuration memory cells. With respect to configuring the array 302, a data line 334 of the read/write 306 may be utilized to receive a portion of the configuration bitstream and provide (e.g., write, store) the received portion to one or more of the memory cells 316A-H and/or other memory cells along the same row that are not explicitly shown in FIG. 3A via bitlines 340 and 342. The data bit of the configuration bitstream that is intended to be stored in the memory cell 316C is the enable bit.

The configuration data can be provided from the data line 334 to the bitlines 340 and 342 via a buffer 370 and a write circuit 372. In an embodiment, the bitlines 340 and 342 form a complementary pair. For example, when the data line 334 has a logic high signal (e.g., "1") intended for the memory cell 316A, the buffer 370 may drive the write circuit 372 via the logic high signal and the write circuit 372 may provide values on the bitlines 340 and 342 indicative of the data line 334 having the logic high signal. In this example, the write circuit 372 may provide a logic high signal on the bitline 340 and a logic low signal on the bitline 342. These signals are stored in the memory cell 316A and are indicative of the memory cell 316A storing a data bit value of 1. Similarly, a data line 336 may be utilized to provide configuration data to one or more of the memory cells 318A-H and/or other memory cells along the same row that are not explicitly shown in FIG. 3A. In an embodiment, the data lines (e.g., 334, 336), buffers (e.g., 370), write circuits (e.g., 372), and bitlines (e.g., 340, 342) may be considered as forming a configuration path for the PLD 300. The data lines may be referred to as configuration ports of the PLD 300. In some cases, when configuration of the PLD 300 is complete, a timing signal that is global to the PLD 300 may be set to activate distributed RAM cells (e.g., allow writing of non-configuration data to the distributed RAM cells).

A normal read operation may be performed to read data bit values stored in any one of the memory cells 316A-H, 318A-H, and/or other memory cells not explicitly shown in FIG. 3A. For example, to read the memory cell 316B, a sense amplifier 338 receives a signal on each of the bitlines 340 and 342. For example, when the data bit value stored in the memory cell 316B is a 0 (e.g., a logic high), the bitline 340 may be a logic low signal and the bitline 342 may be a logic high signal, or vice versa depending on implementation. The sense amplifier 338 determines the data bit value stored in the memory cell 316A based on the signal on the bitlines 340 and 342 and generates a read back value that indicates the data bit value stored in the memory cell 316B is a 0. The read back value is coupled to the data line 334 to be read out from the PLD 300. As further discussed below, an intervening AND gate 344 between the sense amplifier 338 and the data line 334 is configured to provide the same logic value (0 in this example) as that generated by the sense amplifier 338 in the case of a normal read operation. A buffer 346 drives the value provided by the AND gate 344 on the data line 334. In an embodiment, for purposes of a normal read operation, the bitlines, sense amplifiers (e.g., 338), and buffers (e.g., 346) may be considered as forming a read path for the PLD 100.

Similarly, the data line 336 may be utilized to provide read back values for the memory cells 318A-H and/or other memory cells along the same row that are not explicitly shown in FIG. 3A. In some cases, the rows are read out simultaneously or substantially simultaneously. In a normal read operation, as compared to a deterministic read operation, data bit values stored in the distributed RAM cells can be read out via the data lines 334 and 336 without these data bit values being driven to a predetermined value.

In one or more embodiments, the ASR 304 and read/write circuit 306 include logic/memory for facilitating deterministic read back (e.g., for error detection). When an instruction to perform deterministic read back operation on the array 302 is received (e.g., as part of an SED operation), the ASR 304 utilizes/controls an enable bit column enable line 330 and a potential distributed RAM column enable line 332 to facilitate deterministic read back.

The ASR 304 may set the line 330 to a first state (e.g., a "high" or "1" state) when the ASR 304 is asserting the enable bit column 310 (e.g., by asserting the address line 320C), and may set the line 330 to a second state (e.g., a "low" or "0" state) when the ASR 304 is asserting any column of the array 302 other than the enable bit column 310. In an embodiment, the ASR 304 may be referred to as asserting the line 330 when the line 330 is set to the first state and as not asserting the line 330 when the line 330 is set to the second state.

The ASR 304 may set the line 332 to a first state (e.g., a "high" or "1" state) when the ASR 304 is asserting one of the potential distributed RAM columns 312 (e.g., asserting one of the address lines 320D-F), and may set the line 332 to a second state (e.g., a "low" or "0" state) when the ASR 304 is asserting columns of the array 302 that are not the potential distributed RAM memory columns 312. In this regard, the ASR 304 sets the line 332 to the first state whenever any of the potential distributed RAM columns 320 is asserted, regardless of whether the enable bit is asserted (e.g., potential distributed RAM cells are used as distributed RAM cells) or not asserted (e.g., potential distributed RAM cells are used as configuration memory cells). In an embodiment, the ASR 304 may be referred to as asserting the line 332 when the line 332 is set to the first state and as not asserting the line 330 when the line 330 is set to the second state.

The ASR 304 may include, or may be coupled to, logic and/or memory to determine whether or not to assert the line 330 and line 332. In one case, the ASR 304 includes memory to store information identifying column addresses associated with each of the configuration memory columns 308 and 314, enable bit column 310, and/or potential distributed RAM columns 312. As one example, the memory may store a type of column (e.g., configuration memory column, enable bit column, potential distributed RAM column) associated with each of the columns. As another example, the memory may store information indicative of column address boundaries of the different types of columns. The line 330 and/or line 332 may be asserted (e.g., set to logic high) based on the current column selected/asserted by the ASR 304.

In another case, alternatively or in addition, the ASR 304 may include logic (e.g., combinatorial circuits, logic gates) that can be used to provide/set a value on the line 330 and/or line 332 and/or provide a value from which the value to be provided/set on the line 330 and/or line 332 can be derived. For example, the ASR 304 may include circuitry to generate the value for the line 330 and/or line 332 based on an address line currently asserted (e.g., selected) by the ASR 304.

In an embodiment, the read/write circuit 306 includes logic and memory circuitry to facilitate deterministic read back. In this regard, for a potential distributed RAM cell (e.g., the memory cell 318E), the read back value provided by the read/write circuit 306 on the data line (e.g., the data lines 334 and 336) may be a predetermined value or a data bit value based on the state/value of the enable bit. In some cases, some of the circuitry may be shared by multiple rows of the array 302, additional memory cell arrays of the programmable logic block 104, and/or multiple programmable logic blocks of the PLD 100.

In FIG. 3A, the read/write circuit 306 includes a read back circuit and associated shared circuitry for facilitating deterministic read back. The read/write circuit 306 may include a read back circuit that couples bitlines to associated data lines. For example, for the top row of the array 302, the read back circuit includes the sense amplifier 338, AND gate 344, and buffer 346. The read back circuit includes similar components (e.g., sense amplifier, AND gate, buffer) for the bottom row of the array 302. In an embodiment, the read back circuit of the array 302 may be coupled to shared circuitry. In this regard, the read/write circuit 306 includes a shared logic/memory circuit 348 that includes an AND gate 350, an AND gate 352, a distributed RAM enable bit register 354, an AND gate 356, an inverter 358, a distributed RAM status bit register 360, and an inverter 362. As an example, the registers 354 and/or 360 may be implemented as a latch or a flip-flop. In the example shown in FIG. 3A, the registers 354 and 360 are implemented by a set-reset (SR) flip-flop in accordance with the following Table 1:

TABLE 1

| S | R | Q(m + 1) | Description |
|---|---|---|---|
| 0 | 0 | Q(m) | hold state |
| 0 | 1 | 0 | reset |
| 1 | 0 | 1 | set |
| 1 | 1 | not allowed | not allowed |

In Table 1, m represents a moment in time and m+1 represents a next moment in time (e.g., based on a clock signal). The S and R can be considered inputs to the SR flip-flop and Q can be considered a state or an output of the SR flip-flop.

The AND gates 350 and 352 form a logic circuit (also referred to as a combinatorial circuit) for providing the S input and R input, respectively, to the enable bit register 354. The AND gate 356 and the inverter 358 form a logic circuit for providing the S input and R input, respectively, to the status bit register 360. The enable bit register 354 may be referred to as a master register and the status bit register 360 may be referred to as a slave register, in which an output (e.g., $Q_2$) provided by a slave register is based on an output (e.g., $Q_1$) provided by the master register. Thus, the registers 354 and 360 may be referred to as forming a master-slave register. As known by one skilled in the art, a bubble/circle represents a negation. For example, the top input of the AND gate 352 is negated.

In an embodiment, the PLD 100 is configured such that, during deterministic read back, the enable bit is stored at a location (e.g., row address, column address) that allows the enable bit to be read back prior to any potential distributed RAM cell being read back. In some cases, although the ASR 304 knows the column associated with the enable bit, the ASR 304 does not have, and does not need, knowledge of the row associated with the enable bit for purposes of deterministic read back.

In an embodiment, write operations may be performed on distributed RAM cells while error detection (e.g., SED) is being performed. In an embodiment, when potential distributed RAM cells (e.g., LUT cells) are used as distributed RAM cells (e.g., the enable bit is asserted), non-configuration data (e.g., user data) can be written to the distributed RAM cells concurrent with read back being performed on the potential distributed RAM cells. To facilitate simultaneous read back and write, the read/write circuit 306 includes a pre-charge circuit for the bitlines associated with potential distributed RAM cells (e.g., rows that include potential distributed RAM cells). The pre-charge circuit may be driven based on the stored value of the registers 354 and/or 360.

With reference to the data line 334, the pre-charge circuit is formed of transistors 364, 366, and 368 that are driven by the inverter 362. In this regard, the inverter 362 inverts the value provided by the register 360 and provides the inverted value to the transistors 364, 366, and 368. When the transistors 364, 366, and 368 are turned on (e.g., the inverter 362 outputs a logic low), the pre-charge circuit drives the bitlines 340 and 342 to a pre-charge state. For example, the pre-charge state may set both the bitlines 340 and 342 to a logic high.

In an embodiment, the pre-charging may allow writing by the user into the distributed RAM cells while avoiding effects associated with simultaneously attempting to read the memory cells back through the configuration path with the sense amplifier 338. In some cases, without pre-charging both the bitlines 340 and 342 to logic high, the distributed RAM cells may create a sizable differential signal on the bitlines 340 and 342. The sizable differential signal may increase a likelihood of causing write failures when performing write operations via the write circuit, such as when a differential read path is charged in the opposite direction of the write data coming in via the write circuit.

For facilitating discussion of deterministic read back, signals ($v_1$, $v_2$, $v_3$, $v_4$, $v_{sA}$, $v_{RB}$, $S_1$, $S_2$, $R_1$, $R_2$, $Q_1$, and $Q_2$) at various nodes are labeled in FIG. 3A. As indicated previously, 0's and 1's in the discussions below may be flipped depending on implementation. The registers 354 and 360 are initialized such that initially an initial Q state is 0. In some cases, operation of the ASR 304 and read/write circuit 306 during a present deterministic read back operation or a prior read back operation may automatically cause the registers 354 and 360 to have a Q state of 0. In an embodiment, during deterministic read back, the ASR 304 may assert/select one column at a time in a predetermined order. In FIG. 3A, with respect to read back of the array 302, the predetermined order may be from the leftmost column of the array 302 (e.g., the column including the memory cells 316A and 318A) to the rightmost column of the array 302.

Case 1: $b_{enable}=0$ (enable bit is not asserted)

In a first case, consider that the enable bit value is not asserted, in which the enable bit $b_{enalbe}$ stored by the memory cell 316C has a state/value of 0. The ASR 304 asserts a first column of the array 302 via the address line 320A. Since the asserted column is a configuration memory column and does not include the memory cell (e.g., the memory cell 316C) storing the enable bit, the ASR 304 sets the line 330 and the line 332 to 0. In other words, the line 330 and line 332 are not asserted.

With the line 330 set to 0, $v_1=0$ and $S_1=0$. With the line 332 set to 0, $v_2=0$, $v_3=0$, and $S_2=0$. With the Q state of the status bit register 360 initialized to 0, $Q_2(n_1-1)=0$, where $n_1$ can be considered a time instant (e.g., discrete time instant) at which the address line 320A is asserted and $n_1-1$ can be considered an immediately preceding time instant. With $v_2=0$ and $Q_2(n_1-1)=0$, $R_1=0$. With $S_1=0$ and $R_1=0$, $Q_1(n_1)=Q_1(n_1-1)=0$. In this regard, the enable bit register 354 provides an output of $Q_1(n_1)=0$. With $v_3=0$ and $Q_1(n_1)=0$, $S_2=0$ and $R_2=1$. With $S_2=0$ and $R_2=1$, $Q_2(n_1)=0$. In this regard, the status bit register 360 provides an output of $Q_2(n_1)=0$. The inverter 362 inverts $Q_2(n_1)=0$, such that $v_4=1$. Since the AND gate 344 receives $v_4=1$, the AND gate 344 provides an output $v_{RB}$ that is based on $v_{sA}$, which indicates the data bit value read from the memory cell 316A. In this regard, if the memory cell 316A stores a 0, then the output $v_{RB}$ has a value indicative of the memory cell 316A storing a 0. If the memory cell 316A stores a 1, then the output $v_{RB}$ has a value indicative of the memory cell 316 storing a 1.

The output $v_{RB}$ can be coupled to the data line 334 via the buffer 346. Thus, the output $v_{RB}$ may be referred to as the read back value for the memory cell 316A. As shown in FIG. 3A, the data line 336 is coupled to the logic/memory circuit 348 and circuitry (e.g., sense amplifier, AND gate, buffer) similar to that which is coupled to the data line 334. Thus, a value associated with the memory cell 318A may be similarly provided on the data line 336. In addition, since $v_4=1$ from the inverter 362, the transistors 364, 366, and 368 (which form a pre-charge circuit) are off.

After asserting the first column via the address line 320A, the ASR 304 may assert, in sequence, the remaining columns among the configuration memory columns 308 via respective address lines, including asserting the column containing the memory cells 316B and 318B via the address line 320A. In each of these columns, the description of the various signals described above with reference to asserting the address line 320A by the ASR 304 applies. In this regard, when the address line 320B is asserted by the ASR 304, the data bit value stored in the memory cell 316B and 318B are provided on the data line 334 and 336, respectively. In addition, since $v_4=1$ from the inverter 362, the transistors 364, 366, and 368 are off.

The ASR 304 then asserts the enable bit column 310 via the address line 320C. In an embodiment, each programmable logic block may include a single enable bit. Since the asserted column is the enable bit column, the ASR 304 sets the line 330 to 1 and the line 332 to 0. In other words, the line 330 is asserted and the line 332 is not asserted. The sense amplifier 338 receives the value of the enable bit from the memory cell 316C and generates an output $v_{sA}=0$ (since the enable bit is not asserted in the present case).

With the line 330 set to 1 and the enable bit not asserted ($v_{sA}=0$), $S_1=0$. With the line 332 set to 0, $v_2=0$, $v_3=0$, and $S_2=0$. With the Q state of the status bit register 360 remaining at 0 from the enable bit column 310, $Q_2(n_2-1)=0$, where $n_2$ can be considered a time instant at which the address line 320C is asserted and $n_2-1$ can be considered an immediately preceding time instant. With $v_2=0$ and $Q_2(n_2-1)=0$, $R_1=0$. With $S_1=0$ and $R_1=0$, $Q_1(n_2)=Q_1(n_2-1)=0$. In this regard, the value of the enable bit is latched/stored in the enable bit register 354 in response to assertion of the line 330 by the ASR 304. With $v_3=0$ and $Q_1(n_2)=0$, $S_2=0$ and $R_2=1$. With $S_2=0$ and $R_2=1$, $Q_2(n_2)=0$. The inverter 362 inverts $Q_2(n_1)=0$, such that $v_4=1$. Since the AND gate 344 receives $v_4=1$, the AND gate 344 provides the output $v_{RB}$ that is based on $v_{sA}$. In this regard, since the memory cell 316C stores an enable bit state/value of 0, the output $v_{RB}$ has a value indicative of the memory cell 316C storing a 0. The output $v_{RB}$ can be coupled to the data line 334 via the buffer 346 as the read back value for the memory cell 316C. In this regard, when the ASR 304 asserts the enable bit column 310, the value of the enable bit (in this case 0) is set/stored in the enable bit register 354. In addition, since $v_4=1$ from the inverter 362, the transistors 364, 366, and 368 are off.

The ASR 304 asserts a next column of the array 302 via the address line 320D. Since the asserted column is a potential distributed RAM column, the ASR 304 sets the line 330 to 0 and the line 332 to 1. With the line 330 set to 0, $v_1=0$ and $S_1=0$. With the line 332 set to 1, $v_2=1$ and $v_3=1$. With $v_2=1$, $R_1=0$. With the Q state of the enable bit register 354 set to 0 (since the enable bit is not asserted in this case), $Q_1(n_3-1)=0$, where $n_3$ can be considered a time instant at which the address line 320D is asserted and $n_3-1$ can be considered an immediately preceding time instant. With $S_1=0$ and $R_1=0$, $Q_1(n_3)=Q_1(n_3-1)=0$. With $v_3=1$ and $Q_1(n_3)=0$, $S_2=0$ and $R_2=1$. With $S_2=0$ and $R_2=1$, $Q_2(n_3)=0$. The inverter 362 inverts $Q_2(n_3)=0$, such that $v_4=1$. As before, the output $v_{RB}$ of the AND gate 344 that is based on $v_{SA}$, which indicates the data bit value read from the memory cell 316A via the bitlines 340 and 342. In addition, since $v_4=1$ from the inverter 362, the transistors 364, 366, and 368 are off.

After asserting the first column of the potential distributed RAM columns 312 via the address line 320D, the ASR 304 may assert, in sequence, the remaining columns among the potential distributed RAM columns 312 via respective address lines. In each of these columns, the description of the various signals described above with reference to asserting the address line 320D by the ASR 304 applies. In this regard, when the address line 320E is asserted by the ASR 304, the data bit value stored in the memory cell 316E and 318E are provided on the data line 334 and 336, respectively.

In addition, after asserting all the columns of the potential distributed RAM columns 312, the ASR 304 may assert, in sequence, the configuration memory columns 314 of the array 302. In each of these columns, the description of the various signals described above with reference to providing a read back value for the memory cell 316A applies.

Thus, as described above, when the enable bit is not asserted, the read back value provided on the data line (e.g., the data lines 334 and 336) for each memory cell in the array 302 is the data bit value stored by the memory cell.

Case 2: $b_{enable}=1$ (enable bit is asserted)

In a second case, consider that the enable bit is asserted, in which the enable bit value $b_{enable}$ stored in the memory cell 316C has a state/value of 1. The ASR 304 asserts a column of the array 302 via the address line 320A. Since the asserted column is a configuration memory column and does not include the memory cell (e.g., the memory cell 316C) storing the enable bit, the ASR 304 sets the line 330 and the line 332 to 0. In other words, the line 330 and line 332 are not asserted.

With the line 330 set to 0, $v_1=0$ and $S_1=0$. With the line 332 set to 0, $v_2=0$, $v_3=0$, and $S_2=0$. With the Q state of the enable bit register 354 initialized to 0, $Q_2(n_1-1)=0$, where $n_1$ can be considered a time instant (e.g., discrete time instant) at which the address line 320A is asserted and $n_1-1$ can be considered a time instant right before that. With $v_2=0$ and $Q_2(n_1-1)=0$, $R_1=0$. With $S_1=0$ and $R_1=0$, $Q_1(n_1)=Q_1(n_1-1)=0$. In this regard, the enable bit register 354 provides an output of 0. With $v_3=0$ and $Q_1(n_1)=0$, $S_2=0$ and $R_2=1$. With $S_2=0$ and $R_2=1$, $Q_2(n_1)=0$. In this regard, the status bit register 360 provides an output of 0. The inverter 362 inverts $Q_2(n_1)=0$, such that $v_4=1$. Since the AND gate 344 receives $v_4=1$, the AND gate 344 provides an output $v_{RB}$ that is based on $v_{SA}$, which indicates the data bit value read from the memory cell 316A via the bitlines 340 and 342. In this regard, if the memory cell 316A stores a 0, then the output $v_{RB}$ has a value indicative of the memory cell 316 storing a 0. If the memory cell 316A stores a 1, then the output $v_{RB}$ has a value indicative of the memory cell 316 storing a 1.

The output $v_{RB}$ can be coupled to the data line 334 via the buffer 346. Thus, the output $v_{RB}$ may be referred to as the read back value for the memory cell 316A. As shown in FIG. 3A, the data line 336 is coupled to the logic/memory circuit 348 and circuitry (e.g., sense amplifier, AND gate, buffer) similar to that is coupled to the data line 334. Thus, a value associated with the memory cell 318A may be similarly provided on the data line 336. In addition, since $v_4=1$ from the inverter 362, the transistors 364, 366, and 368 are off.

After asserting the first column via the address line 320A, the ASR 304 may assert, in sequence, the remaining columns among the configuration memory columns 308 via respective address lines, including asserting the column containing the memory cells 316B and 318B via the address line 320B. In each of these columns, the description of the various signals described above with reference to providing a read back value for the memory cell 316A applies. In this regard, when the address line 320B is asserted by the ASR 304, the data bit value stored in the memory cell 316B and 318B are provided on the data line 334 and 336, respectively. In addition, since $v_4=1$ from the inverter 362, the transistors 364, 366, and 368 are off.

The ASR 304 then asserts the enable bit column 310 via the address line 320C. Since the asserted column is the enable bit column, the ASR 304 sets the line 330 to 1 and the line 332 to 0. In other words, the line 330 is asserted and the line 332 is not asserted. The sense amplifier 338 receives the value of the enable bit from the memory cell 316C and generates an output $v_{SA}=1$.

With the line 330 set to 1 and the enable bit asserted $(V_{SA}=1)$, $S_1=1$. With the line 332 set to 0, $v_2=0$, $v_3=0$, and $S_2=0$. With the Q state of the enable bit register 354 remaining at 0 from the configuration memory columns 308, $Q_1(n_2-1)=0$, where $n_2$ can be considered a time instant at which the address line 320C is asserted and $n_2-1$ can be considered a time instant right before that. With $v_2=0$ and $Q_2(n_2-1)=0$, $R_1=0$. With $S_1=1$ and $R_1=0$, $Q_1(n_2)=1$. With $v_3=0$ and $Q_1(n_2)=1$, $S_2=0$ and $R_2=1$. With $S_2=0$ and $R_2=1$, $Q_2(n_2)=0$. The inverter 362 inverts $Q_2(n_1)=0$, such that $v_4=1$. Since the AND gate 344 receives $v_4=1$, the AND gate 344 provides the output $v_{RB}$ that is based on $v_{SA}$. In this regard, since the memory cell 316C stores a 1, then the output $v_{RB}$ has a value indicative of the memory cell 316C storing a 1. The output $v_{RB}$ can be coupled to the data line 334 via the buffer 346 as the read back value for the memory cell 316C. In this regard, when the ASR 304 asserts the enable bit column 310, the value of the enable bit is set (e.g., stored, latched) in the enable bit register 354. In addition, since $v_4=1$ from the inverter 362, the transistors 364, 366, and 368 are off.

The ASR 304 then asserts a column of the array 302 via the address line 320D. Since the asserted column is a potential distributed RAM column, the ASR 304 sets the line 330 to 0 and the line 332 to 1. With the line 330 set to 0, $v_1=0$ and $S_1=0$. With the line 332 set to 1, $v_2=1$ and $v_3=1$. With $v_2=1$, $R_1=0$. With the Q state of the enable bit register 354 set to 1 (since the enable bit is asserted in this case), $Q_1(n_3-1)=1$, where $n_3$ can be considered a time instant at which the address line 320D is asserted. With $S_1=0$ and $R_1=0$, $Q_1(n_3)=Q_1(n_3-1)=1$. With $v_3=1$ and $Q_1(n_3)=1$, $S_2=1$ and $R_2=0$. With $S_2=1$ and $R_2=0$, $Q_2(n_3)=1$. The inverter 362 inverts $Q_2(n_3)=1$, such that $v_4=0$. Since the AND gate 344 receives $v_4=0$, the AND gate 344 provides an output $v_{RB}=0$ regardless of the data bit value stored in the memory cell 316D. The output $v_{RB}=0$ can be coupled to the data line 334 via the buffer 346 as the read back value for the memory cell 316D. In this regard, as indicated by the enable bit being asserted, the data bit value stored in the memory cell 316D is non-configuration data. To allow deterministic read back, the read/write circuit 306 drives the output $v_{RB}$ to the predetermined value. In FIG. 3A, the predetermined value is 0; however, the predetermined value can be another value in other implementations. In addition, since $v_4=0$ from the inverter 362, the transistors 364, 366, and 368 are on.

After asserting the first column of the potential distributed RAM columns 312 via the address line 320D, the ASR 304 may assert, in sequence, the remaining columns among the potential distributed RAM columns 312 via respective address lines, including asserting the column containing the memory cells 316E and 318E via the address line 320E. In each of these columns, the description of the various signals described above with reference to providing a read back value for the memory cell 316D applies. For example, when the address line 320E is asserted by the ASR 304, the predetermined value is provided on the data lines 334 and 336 as a read back value for the memory cells 316E and 318E, respectively, rather than the data bit values stored in the memory cells 316E and 318E. In addition, since $v_4=0$ from the inverter 362, the transistors 364, 366, and 368 are on.

The ASR 304 then asserts a column of the array 302 via the address line 320F. Since the asserted column is a configuration column, the ASR 304 sets the line 330 to 0 and the line 332 to 0. With the line 330 set to 0, $v_1=0$ and $S_1=0$. With the line 332 set to 0, $v_2=0$ and $v_3=0$. With the Q state of the status bit register 360 remaining at 1 from a potential distributed RAM column having been asserted via the address line 320E, $Q_2(n_4-1)=1$, where $n_4$ can be considered a time instant at which the address line 320F is asserted. With $v_2=0$ and $Q_2(n_4-1)=1$, $R_1=1$. With $S_1=0$ and $R_1=1$, $Q_1(n_4)=0$. In this regard, the value of the enable bit can be considered as being reset to 0 in the enable bit register 354. With $v_3=0$ and $Q_1(n_4)=0$, $S_2=0$ and $R_2=1$. With $S_2=0$ and $R_2=1$, $Q_2(n_4)=0$. The inverter 362 inverts $Q_2(n_4)=0$, such that $v_4=1$. Since the AND gate 344 receives $v_4=1$, the AND gate 344 provides the output $v_{RB}$ that is based on $v_{S4}$. In this regard, the data bit value stored in the memory cell 316F is provided as a read back value on the data line 334. In addition, since $v_4=1$ from the inverter 362, the transistors 364, 366, and 368 are off.

The ASR 304 then asserts a next column of the array 302 via the address line 320G. Since the asserted column is a configuration column, the ASR 304 sets the line 330 to 0 and the line 332 to 0. With the line 330 set to 0, $v_1=0$ and $S_1=0$. With the line 332 set to 0, $v_2=0$ and $v_3=0$. With the Q state of the status bit register 360 having been set to 0 from the previous configuration column having been asserted via the address line 320F, $Q_2(n_5-1)=0$, where $n_5$ can be considered a time instant at which the address line 320G is asserted. With $v_2=0$ and $Q_2(n_5-1)=0$, $R_1=0$. With the Q state of the enable bit register 354 having been reset to 0, $Q_1(n_5-1)=0$. With $S_1=0$ and $R_1=0$, $Q_1(n_5)=Q_1(n_5-1)=0$. With $v_3=0$ and $Q_1(n_5)=0$, $S_2=0$ and $R_2=1$. With $S_2=0$ and $R_2=1$, $Q_2(n_5)=0$. The inverter 362 inverts $Q_2(n_5)=0$, such that $v_4=1$. Since the AND gate 344 receives $v_4=1$, the AND gate 344 provides the output $v_{RB}$ that is based on $v_{S4}$. In this regard, the data bit value stored in the memory cell 316G is provided as a read back value on the data line 334. In addition, since $v_4=1$ from the inverter 362, the transistors 364, 366, and 368 are off. As indicated above, the registers 354 and 360 are reset once all address lines of the potential distributed RAM columns 312 have been asserted.

After asserting the second column of the configuration memory columns 314 via the address line 320G, the registers 354 and 360 provide an output of 0 and can be considered as having been completely reset (e.g., placed in their initial state). The ASR 304 may assert, in sequence, the remaining columns among the configuration memory columns 314 via respective address lines, including asserting the column containing the memory cells 316H and 318H via the address line 320H. In each of these columns, the description of the various signals described above with reference to providing a read back value for the memory cell 316G applies. For example, when the address line 320H is asserted by the ASR 304, the data bit value stored in the memory cells 316H and 318H is provided on the data lines 334 and 336, respectively, as a read back value for the memory cells 316H and 318H. In addition, since $v_4=1$ from the inverter 362, the transistors 364, 366, and 368 are off.

Thus, from the above discussion, the ASR 304 and read/write circuit 306 facilitate deterministic read back based on the value of the enable bit and a location (e.g., column address) of the enable bit. The enable bit register 354 stores the value of the enable bit in response to assertion of the enable bit column by the ASR 304. When the enable bit is asserted (e.g., set to 1), as indicated by the enable bit register 354 storing a 1, and a distributed RAM column is asserted by the ASR 304, the read back circuit (including, e.g., 338, 344, 346) provides (e.g., passes, reads out) a predetermined data bit value to the data lines 334 and 336. When the enable bit is asserted and a configuration memory column is asserted by the ASR 304, the read back circuit provides (e.g., passes, reads out) a data bit value stored by the associated memory cells to the data lines 334 and 336. When the enable bit is not asserted, the read back circuit provides the data bit value stored by the associated memory cells to the data lines 334 and 336. These deterministic read back values may be provided by the read back circuit (e.g., to an external system) for error detection processing (e.g., SED processing). In addition, the pre-charge circuit is configured to pre-charge the bitlines associated with distributed RAM cells when distributed RAM cells are being read back, e.g. to facilitate simultaneous read back of and write to the distributed RAM cells. The pre-charge circuit is turned off in other cases.

In some embodiments, the various components for facilitating deterministic read back, such as the line 330, line 332, logic/memory circuit 348 and components therein, and AND gate 344, may be provided for (e.g., coupled to, connected to) rows of the array 302 that include potential distributed RAM cells. In these embodiments, for rows of the array 302 that do not include potential distributed RAM cells, the read/write circuit 306 may provide components such as buffers (e.g., 346, 370) along the read and write paths, sense amplifier (e.g., 338), and write circuit (e.g., 372), e.g. without additional circuitry for driving data lines to predetermined values independent of the data bit values stored by the memory cells. For instance, the read back circuit may provide the buffer(s) and sense amplifiers) for the rows that do not include potential distributed RAM cells. In some cases, the various components may be shared by multiple programmable logic blocks, e.g. through use of switching circuitry to couple the components to the programmable logic block currently being read back (e.g., the programmable logic block whose address line is being asserted by the ASR 304).

In an embodiment, a portion of memory cells in the potential distributed RAM columns 312 is used as configuration memory, whereas remaining memory cells in the potential distributed RAM columns 312 are used as distributed RAM. For instance, the array 302 may include additional rows of memory cells not shown in FIG. 3A, with the two rows in FIG. 3A being two of the rows with potential distributed RAM. In an embodiment, the potential distributed RAM columns are contiguous.

It is noted that the array 302 provides one example of the arrangement of configuration memory columns (e.g., 308, 314), enable bit column (e.g., 310), and potential distributed RAM columns (e.g., 312). For example, in some cases, the enable bit column may be a first column of the array 302. As another example, one or more configuration memory columns may be situated between the enable bit column and a first potential distributed RAM column. As another example, a last column of the array 302 may be a distributed RAM column.

Figure 3B:
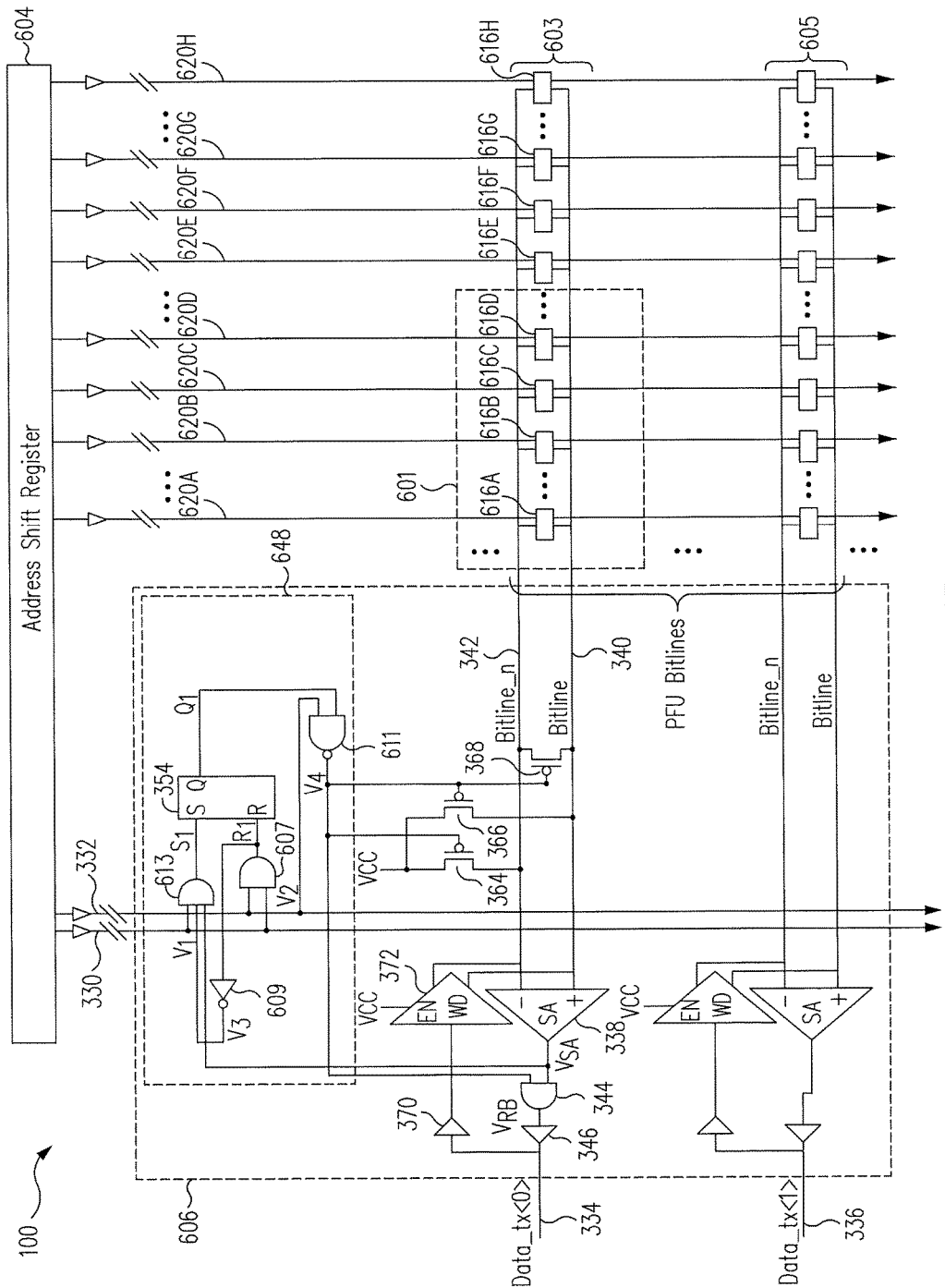
FIG. 3B illustrates a schematic diagram of a portion of a PLD for facilitating deterministic read back and error detection for PLDs in accordance with another embodiment of the disclosure.

FIG. 3B illustrates a schematic diagram of a portion of PLD 100 for facilitating deterministic read back and error detection for PLDs in accordance with another embodiment of the disclosure. The PLD 100 includes a memory cell array, an ASR 604, and a read/write circuit 606. The ASR 604 includes some components in common with the ASR 304 in FIG. 3A (e.g., 330, 332), but also includes some differences in implementation. The read/write circuit 606 includes some components in common with the read/write circuit 306 in FIG. 3A (e.g., 338, 344, 346, 354, 364, 366, 368, 370, 372), but also includes some differences in implementation. As discussed herein, in FIG. 3B, a single register (e.g., 354) is used for facilitating deterministic read back and error detection.

The array includes memory cells arranged in columns and rows and associated with a programmable logic block 104. Although FIG. 3B illustrates two rows and seven columns of memory cells, the array may include a different number (e.g., more, fewer) of rows and/or columns than that shown in FIG. 3B. In an embodiment, a row 603 of the array includes a group 601 of potential distributed RAM cells and configuration memory cells 616E-H. The group 601 includes potential distributed RAM cells 616A-D. A row 605 includes only configuration memory cells. For purposes of discussion, the memory cell 616H stores the enable bit (e.g., after configuration of the PLD 100).

The read/write circuit 306 includes a shared logic/memory circuit 648 that includes the enable bit register 354, an AND gate 613, an AND gate 607, an inverter 609, and a NAND gate 611. As shown in FIG. 3B, the row 603 of memory cells is coupled to circuitry (e.g., 344, 648) of the read/write circuit 606 such that deterministic read back can be performed, whereas the row 605 of memory cells does not need to perform deterministic read back and is not coupled to such circuitry.

The ASR 604 may be utilized to selectively assert columns of the array via address lines 620A-H. In addition, the ASR 604 may be utilized to selectively assert columns of another programmable logic block (not shown) and/or other memory via additional address lines not shown in FIG. 3B. In an embodiment, when an instruction to perform deterministic read back operation on the array is received (e.g., as part of an SED operation), the ASR 604 utilizes/controls the lines 330 and 332.

For facilitating discussion of deterministic read back, signals ($v_1$, $v_2$, $v_3$, $v_4$, $S_1$, and $Q_1$) at various nodes are labeled in FIG. 3B. As indicated previously, 0's and 1's in the discussions below may be flipped depending on implementation. During deterministic read back, the ASR 304 may assert/select one column at a time in a predetermined order. In FIG. 3B, with respect to read back of the array, the predetermined order may be from the rightmost column of the array (e.g., the column including the memory cell 616H) to the leftmost column of the array (e.g., the column including the memory cell 616A). In FIG. 3B, the address line 620A is the last address line associated with potential distributed RAM, e.g. memory cells to the left of the memory cell 316A (if any) are configuration memory cells.

Case 1: $b_{enable}=0$ (enable bit is not asserted)

In a first case, consider that the enable bit value is not asserted, in which the enable bit $b_{enable}$ stored by the memory cell 616H has a state/value of 0. The ASR 604 asserts a first column of the array via the address line 620H. Since the asserted column includes the enable bit memory cell 616H, the ASR 604 sets the line 330 to 1 and sets the line 332 to 0 (e.g., maintains the line 632 at 0). In other words, the line 330 is asserted and line 332 is not asserted.

With the line 330 set to 1 and the enable bit not asserted ($v_{SA}=0$), $S_1=0$. With the line 332 set to 0, $v_2=0$ and $R_1=0$. With the Q state of the register 354 set (e.g., initialized, reset) to 0, $Q_1(p_1-1)=0$, where $p_1$ can be considered a time instant at which the address line 620H is asserted and $p_1-1$ can be considered an immediately preceding time instant. With $S_1=0$ and $R_1=0$, $Q_1(p_1)=Q_1(p_1-1)=0$. With $v_2=0$ and $Q_1(p_1)=0$, the NAND gate 611 provides $v_4=1$. Since the AND gate 344 receives $v_4=1$, the AND gate 344 provides the output $v_{RB}$ that is based on $v_{SA}$. In this regard, since the memory cell 616H stores an enable bit state/value of 0, the output $v_{RB}$ has a value indicative of the memory cell 616H storing a 0. The output $v_{RB}$ can be coupled to the data line 334 via the buffer 346 as the read back value for the memory cell 616H. In this regard, when the ASR 604 asserts the address line 620H that includes the enable bit memory cell 616H, the value of the enable bit (in this case 0) is set/stored in the register 354. In addition, since $v_4=1$ from the NAND gate 611, the transistors 364, 366, and 368 are off.

After asserting the address line 620H, the ASR 604 may assert, in sequence, the address lines 620G, 620F, and 620E. For each associated column, the lines 330 and 332 are set to 0. When the address line 620G is asserted, the lines 330 and 332 are set to 0. Since the line 330 is set to 0, $v_1=0$, $S_1=0$, and $R_1=0$. With the Q state of the register 354 remaining at 0 from the enable bit memory cell 616H, $Q_1(p_2-1)=0$, where $p_2$ can be considered a time instant at which the address line 620G is asserted and $p_2-1$ can be considered an immediately preceding time instant. Since $S_1=0$ and $R_1=0$, $Q_1(p_2)=Q_1(p_2-1)=0$. Since $Q_1(p_2)=0$ and $v_2=0$, the NAND gate 611 provides $v_4=1$. Since $v_4=1$, the data bit value stored in the memory cell 616G is provided as the read back value $v_{RB}$ on the data line 334. In addition, since $v_4=1$, the transistors 364, 366, and 368 are off. For the address lines 620F and 620E, the description of the various signals remains the same as when the address line 620G is asserted by the ASR 604.

The ASR 604 then asserts the address line 616D, which is a first column of the array that is a potential distributed RAM column. The ASR 604 sets the line 330 to 0 and the line 332 to 1. With the line 330 set to 0, $v_1=0$, $S_1=0$, and $R_1=0$. The Q state of the register 354 remains at 0 from the enable bit memory cell 616H, such that $Q_1(p_3-1)=0$, where $p_3$ can be considered a time instant at which the address line 620D is asserted and $p_2-1$ can be considered an immediately preceding time instant. With $S_1=0$ and $R_1=0$, $Q_1(p_3)=Q_1(p_3-1)=0$. Since $Q_1(p_3)=0$ and $v_2=0$, the NAND gate 611 provides $v_4=1$. Since $v_4=1$, the data bit value stored in the memory cell 616D is provided as the read back value $v_{RB}$ on the data line 334. In addition, since $v_4=1$, the transistors 364, 366, and 368 are off. After asserting the address line 620D, the ASR 604 may assert, in sequence, the address lines 620C, 620B, and 620A. For the address lines 620C, 620B, and 620A, the description of the various signals remains the same as when the address line 620D is asserted by the ASR 604.

Thus, as described above, when the enable bit is not asserted, the read back value provided on the data line (e.g., the data lines 334 and 336) for each memory cell in the array is the data bit value stored by the memory cell.

In an embodiment, once all the distributed RAM columns have been asserted by the ASR 604, the register 354 may be reset, e.g. prior to asserting a next column (not shown) by the ASR 604. In this embodiment, the ASR 604 sets the lines 330 and 332 to 1. With the line 330 set to 1, $v_1=1$. With the line 332 set to 1, $v_2=1$. With $v_1=1$ and $v_2=1$, $R_1=1$ and $v_3=0$. With $v_3=0$, $S_1=0$. With $S_1=0$ and $R_1=1$, $Q_1(p_4)=0$. In this regard, the value of the enable bit can be considered as being reset to 0 in the register 354 (although in this case the enable bit is 0 to begin with).

Case 2: $b_{enable}=1$ (enable bit is asserted)

In a second case, consider that the enable bit is asserted, in which the enable bit value $b_{enable}$ stored in the memory cell 616H has a state/value of 1. The ASR 604 asserts a column of the array via the address line 620H. Since the asserted column includes the memory cell 616H, which stores the enable bit, the ASR 604 sets the line 330 to 1 and sets the line 332 to 0 (e.g., maintains the line 632 at 0).

With the line 330 set to 1, $v_1=1$. With the line 332 set to 0, $v_2=0$ and $R_1=0$. With $R_1=0$, $v_3=1$. With $v_1=1$, $v_3=1$, and the enable bit asserted ($v_{SA}=1$), $S_1=1$. With $S_1=1$ and $R_1=0$, $Q_1(p_1)=1$, where $p_1$ can be considered a time instant at which the address line 620H. In this regard, the value of the enable bit is set (e.g., stored, latched) in the register 354. With $Q_1(p_1)=1$ and $v_2=0$, the NAND gate 611 provides $v_4=1$. Since the AND gate 344 receives $v_4=1$, the AND gate 344 provides the output $v_{RB}$ that is based on $v_{SA}$. The data bit value stored in the memory cell 616H ($V_{SA}=1$ in this case) is provided as the read back value $v_{RB}$ on the data line 334. In addition, since $v_4=1$, the transistors 364, 366, and 368 are off.

After asserting the address line 620H, the ASR 604 may assert, in sequence, the address lines 620G, 620F, and 620E. For each associated column, the lines 330 and 332 are set to 0. When the address line 620G is asserted, the lines 330 and 332 are set to 0. Since the line 330 is set to 0, $v_1=0$, $S_1=0$, and $R_1=0$. With the Q state of the register 354 remaining at 1 from the enable bit memory cell 616H, $Q_1(p_2-1)=1$, where $p_2$ can be considered a time instant at which the address line 620G is asserted and $p_2-1$ can be considered an immediately preceding time instant. Since $S_1=0$ and $R_1=0$, $Q_1(p_2)=Q_1(p_2-1)=1$. Since $Q_1(p_2)=1$ and $v_2=0$, the NAND gate 611 provides $v_4=1$. Since $v_4=1$, the data bit value stored in the memory cell 616G is provided as the read back value $v_{RB}$ on the data line 334. In addition, since $v_4=1$, the transistors 364, 366, and 368 are off. For the address lines 620F and 620E, the description of the various signals remains the same as when the address line 620G is asserted by the ASR 604.

The ASR 604 then asserts the address line 616D, which is the first column of the array that is a potential distributed RAM column. The ASR 604 sets the line 330 to 0 and the line 332 to 1. With the line 330 set to 0, $v_1=0$, $S_1=0$, and $R_1=0$. With the line 332 set to 1, $v_2=1$. The Q state of the register 354 remains at 1 from the enable bit memory cell 616H, such that $Q_1(p_3-1)=1$, where $p_3$ can be considered a time instant at which the address line 620D is asserted and $p_1-1$ can be considered an immediately preceding time instant. With $S_1=0$ and $R_1=0$, $Q_1(p_3)=Q_1(p_3-1)=1$. Since $Q_1(p_3)=1$ and $v_2=1$, the NAND gate 611 provides $v_4=0$.

Since the AND gate 344 receives $v_4=0$, the AND gate 344 provides an output $v_{RB}=0$ regardless of the data bit value stored in the memory cell 616D. The output $v_{RB}=0$ can be coupled to the data line 334 via the buffer 346 as the read back value for the memory cell 616D. In this regard, as indicated by the enable bit being asserted, the data bit value stored in the memory cell 616D is non-configuration data. To allow deterministic read back, the read/write circuit 606 drives the output $v_{RB}$ to the predetermined value. In FIG. 3B, the predetermined value is 0; however, the predetermined value can be another value in other implementations. In addition, since $v_4=0$ from the NAND gate 611, the transistors 364, 366, and 368 are on.

After asserting the first column of the potential distributed RAM columns via the address line 620D, the ASR 604 may assert, in sequence, the remaining potential distributed RAM columns via respective address lines 620C, 620B, and 620A. In each of these columns, the description of the various signals described above with reference to providing a read back value for the memory cell 616D applies. For example, when the address line 620B is asserted by the ASR 604, the predetermined value is provided on the data line 334 as a read back value for the memory cells 616B rather than the data bit value stored in the memory cell 616B. In addition, since $v_4=0$ from the NAND gate 611, the transistors 364, 366, and 368 are on.

In an embodiment, once all the distributed RAM columns have been asserted by the ASR 604, the register 354 may be reset, e.g. prior to asserting a next column (not shown) by the ASR 604. In this embodiment, the ASR 604 sets the lines 330 and 332 to 1. With the line 330 set to 1, $v_1=1$. With the line 332 set to 1, $v_2=1$. With $v_1=1$ and $v_2=1$, $R_1=1$ and $v_3=0$. With $v_3=0$, $S_1=0$. With $S_1=0$ and $R_1=1$, $Q_1(p_4)=0$. In this regard, the value of the enable bit can be considered as being reset to 0 in the register 354.

Thus, from the above discussion, the ASR 604 and read/write circuit 606 facilitate deterministic read back based on the value of the enable bit and a location (e.g., column address) of the enable bit. The register 354 stores the value of the enable bit in response to assertion of the enable bit column via the address line 620H by the ASR 604. When the enable bit is asserted (e.g., set to 1), as indicated by the register 354 storing a 1, and a distributed RAM column is asserted by the ASR 604, the read back circuit (including, e.g., 338, 344, 346) provides (e.g., passes, reads out) a predetermined data bit value to the data lines 334 and 336. When the enable bit is asserted and a configuration memory column is asserted by the ASR 604, the read back circuit provides (e.g., passes, reads out) a data bit value stored by the associated memory cells to the data lines 334 and 336. When the enable bit is not asserted, the read back circuit provides the data bit value stored by the associated memory cells to the data lines 334 and 336. These deterministic read back values may be provided by the read back circuit (e.g., to an external system) for error detection processing (e.g., SED processing). In addition, the pre-charge circuit is configured to pre-charge the bitlines associated with distributed RAM cells when distributed RAM cells are being read back, e.g. to facilitate simultaneous read back of and write to the distributed RAM cells. The pre-charge circuit is turned off in other cases.

As described above, in the example architectures shown in FIGS. 3A and 3B, to facilitate deterministic feedback, the memory cells of the array (e.g., 302 in FIG. 3A) are arranged to store the enable bit (e.g., 316C in FIG. 3A, 616H in FIG. 3B) at a memory cell that is read prior to a memory cell that can potentially contain non-configuration data (e.g., 316D-F in FIG. 3A, 616A-D in FIG. 3B). Alternatively and/or in addition, the ASRs (e.g., 304, 604) and the read/write circuit (e.g., 306, 606) may be configured to cause the memory cell that stores the enable bit to be read prior to any potential distributed RAM cell.

It is noted that FIGS. 3A and 3B illustrates examples in which the array includes a single enable bit (e.g., stored in 316C in FIG. 3A, 616H in FIG. 3B) with an associated group of potential distributed RAM columns (e.g., 316D-F in FIG. 3A, 616A-D in FIG. 3B) controlled by the enable bit. In some cases, an array of memory cells may include multiple enable bits, with each enable bit controlling an associated group of distributed RAM columns.

Figure 4A:
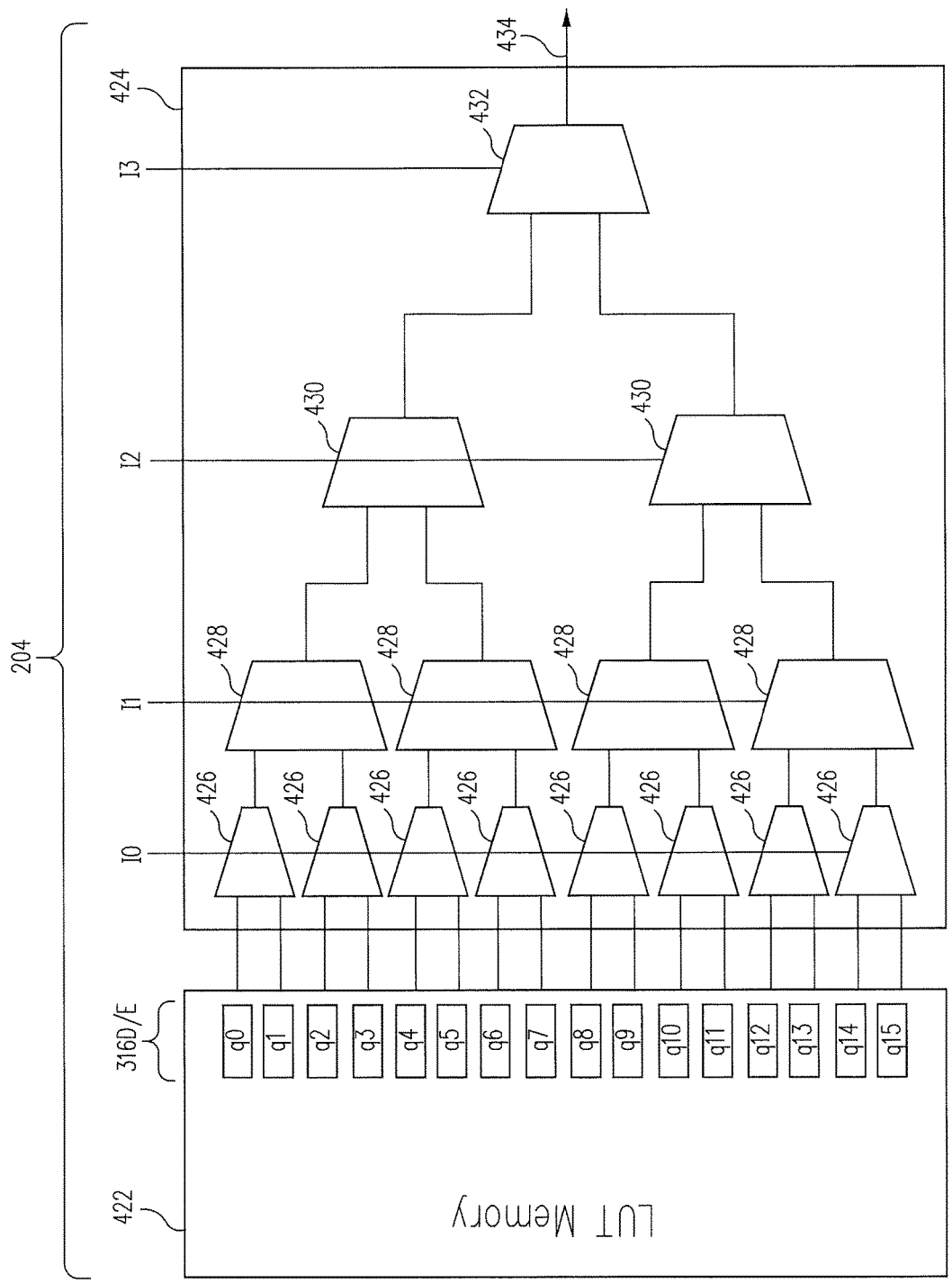
FIG. 4A illustrates an example LUT in accordance with an embodiment of the present disclosure.

FIG. 4A illustrates an example LUT 204 in accordance with an embodiment of the present disclosure. The LUT 204 includes LUT memory 422 and associated decoder 424. The LUT memory 422 includes the memory cells 316D-E (e.g., 16 memory cells). The decoder 424 accepts four inputs $I_0$, $I_1$, $I_2$, and $I_3$, and provides a data bit value of one of the memory cells 316D-E (e.g., one of $q_1$ through $q_{15}$) as an output signal 434 of the decoder 424. The decoder 424 includes multiplexers 426 (e.g., 2:1 multiplexers), 428, 430, and 432. The multiplexers 426 select one of two inputs based on the input $I_0$. For example, the multiplexer 426 coupled to memory cells $q_2$ and $q_3$ receives as its inputs the data bit values stored in the memory cells $q_2$ and $q_3$, and provides as its output the data bit value stored in the memory cell $q_2$ when $I_0$ is 0 and the data bit value stored in the memory cell $q_3$ when $I_0$ is 1. Similarly, the multiplexers 428, 430, and 432 provide their respective outputs based on the inputs $I_1$, $I_2$, and $I_3$, respectively. The output of the multiplexer 432 is provided as the output signal 434 of the decoder 424. In this regard, the inputs $I_0$, $I_1$, $I_2$, and $I_3$ are utilized to read one of the memory cells 316D-E and may be referred to as selector inputs or selector signals.

In some embodiments, the memory cells 316D-E of LUT 204 may be used as LUT memory for storing LUT data (e.g., configuration data). The decoder 424 may be utilized to provide logic functionality of the LUT 204. In other embodiments, the memory cells 316D-E of LUT 204 may be allocated as potential distributed RAM to be used as LUT memory or distributed RAM based on an enable bit. When the enable bit is not asserted, the memory cells 316D-E of LUT 204 are used as LUT memory for storing LUT data, and the decoder 424 may be utilized to provide logic functionality of the LUT 204. When the enable bit is asserted, the memory cells 316D-E of LUT 204 are used as distributed RAM for storing non-configuration data (e.g., user data), and the decoder 424 may be used as a read decode circuit to allow selection of the memory cells 316D-E using the inputs $I_0$, $I_1$, $I_2$, and $I_3$ and associated read out of the selected memory cell.

Figure 4B:
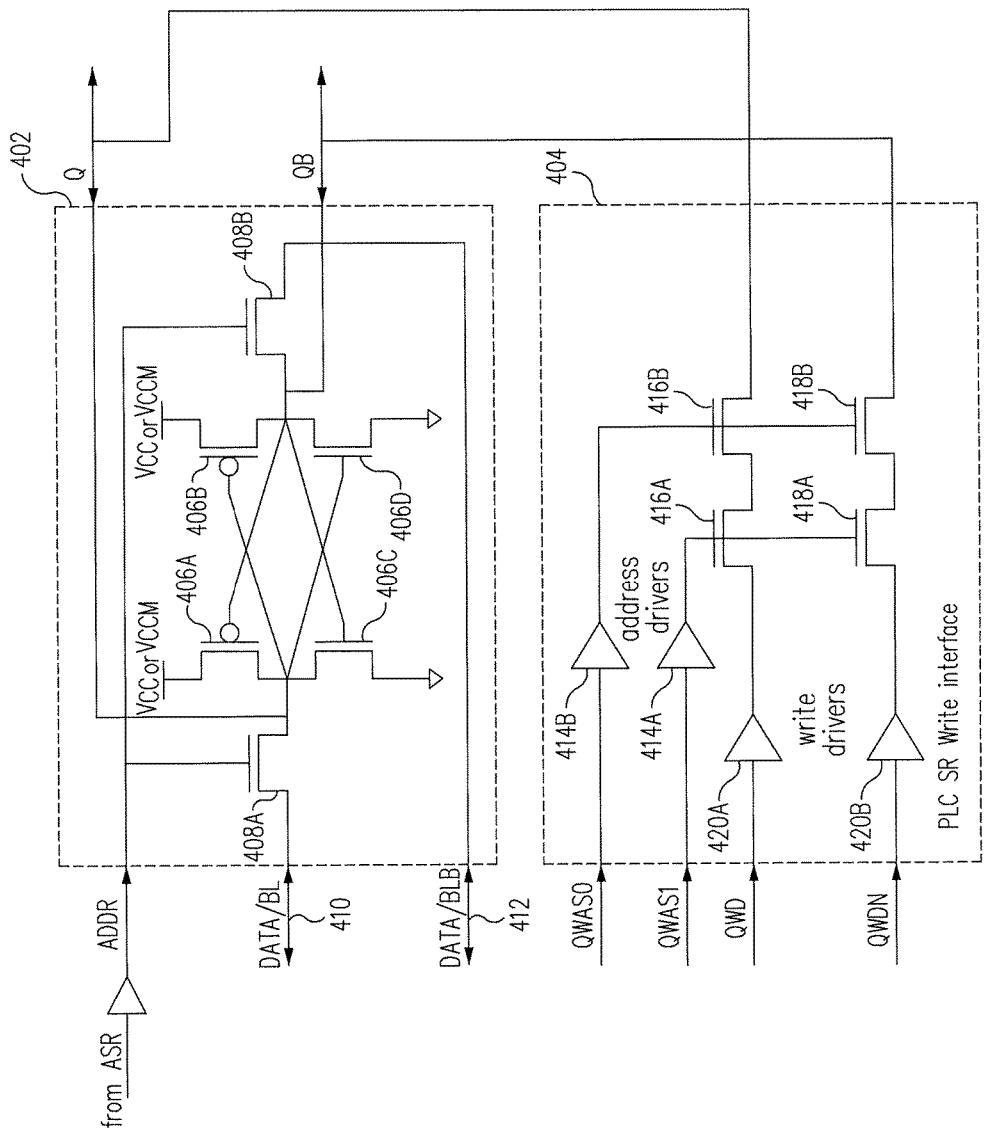
FIG. 4B illustrates an example of a potential distributed RAM cell and an associated write circuit in accordance with an embodiment of the present disclosure.

FIG. 4B illustrates an example of a potential distributed RAM cell 402 and an associated write circuit 404 in accordance with an embodiment of the present disclosure. In an embodiment, the potential distributed RAM cell 402 may be any one of the memory cells 316D-E or 318D-E.

The memory cell 402 is an SRAM cell formed of cross-coupled transistors 406A-D and access transistors 408A-B. When an ASR (e.g., the ASR 304) asserts a column containing the memory cell 402, the access transistors 408A-B are turned on to allow a data bit value stored using the cross-coupled transistors 406A-D to be provided as complementary signals on bitlines 410 and 412. For example, when the memory cell 402 stores a data bit value of 1, a 1 is provided on the bitline 410 and a 0 is provided on the bitline 412 is provided a 0. For example, the memory cell 402 may be the memory cell 316E and the bitlines 410 and 412 may be the bitlines 340 and 342, respectively.

When the enable bit is asserted, the write circuit 404 may be utilized to allow the user to access the memory cell 402 and write non-configuration data (e.g., user data) to the memory cell 402. In some cases, the write circuit 404 may write the non-configuration data simultaneous with the memory cell 402 and/or other distributed RAM cells being read as part of a deterministic read back operation. In this regard, address drivers 414A and 414B may be utilized to turn on access transistors 416A-B and 418A-B, respectively, and write drivers 420A-B may be utilized to write data into the memory cell 402.

In an embodiment, an additional write circuit (e.g., the write circuit 404) is provided for potential distributed RAM cells. In this regard, in an embodiment, the additional write circuit is not provided for configuration memory cells, since the configuration memory cell will not be rewritten after configuration.

In an embodiment, the potential distributed RAM cells may use different voltages when used as configuration memory and when used as distributed RAM. For example, when used as distributed RAM, the potential distributed RAM cells may be powered at a $V_{CC}$ level. When used as configuration memory, the potential distributed RAM cells may be powered at a $V_{CCM}$ level. In some cases, the $V_{CC}$ level and $V_{CCM}$ level may be provided by different power supplies. In other cases, the $V_{CC}$ and $V_{CCM}$ levels may be generated from a common power supply, such as a $V_{CC}$ power supply. In such cases, a level translator may be deployed to switch between $V_{CCM}$ and $V_{CC}$ levels.

Figure 5:
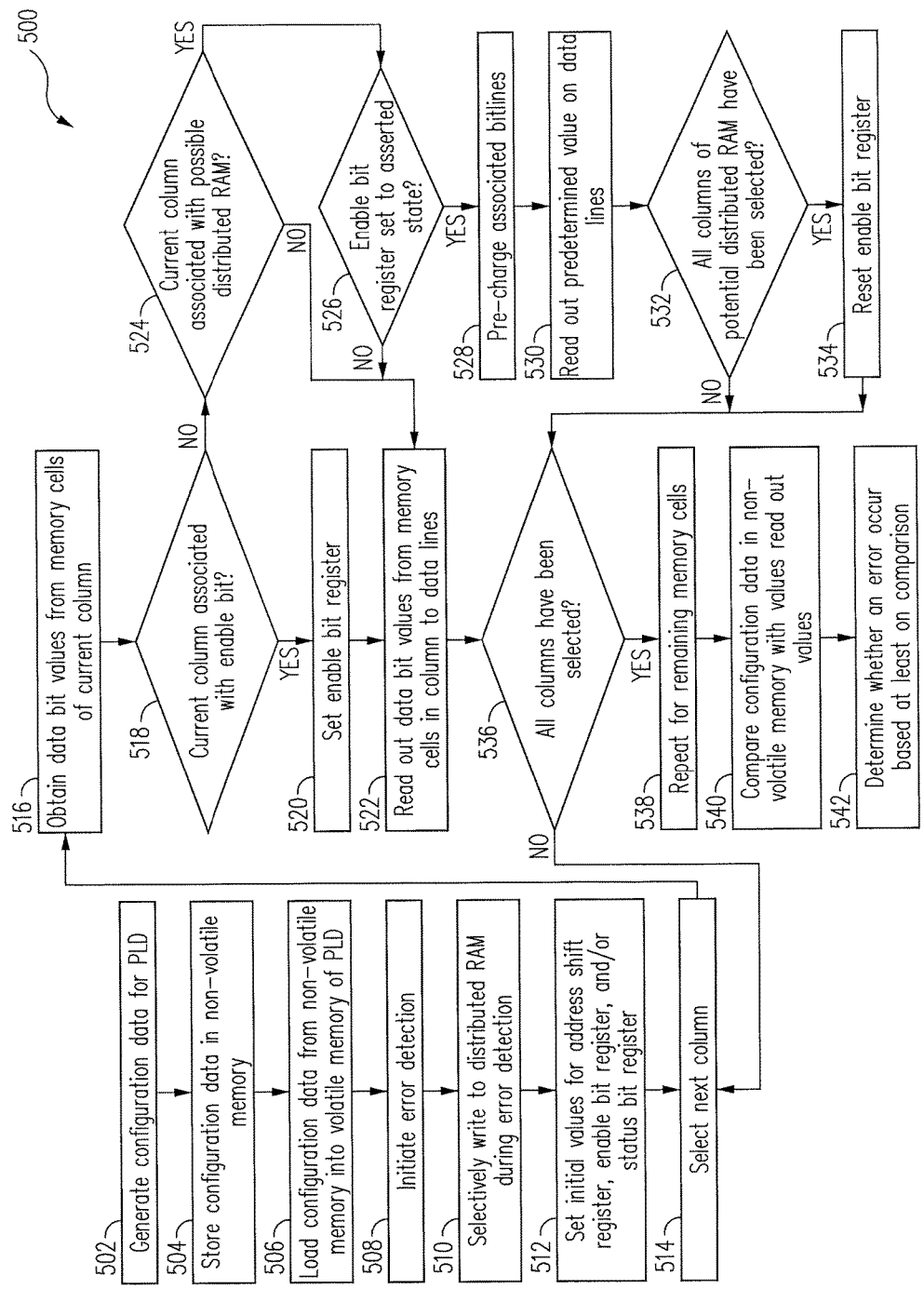
FIG. 5 illustrates a flow diagram of an example process for facilitating deterministic read back and error detection for a PLD in accordance with one or more embodiments of the present disclosure.

FIG. 5 illustrates a flow diagram of an example process 500 for facilitating deterministic read back and error detection for a PLD in accordance with one or more embodiments of the present disclosure. For explanatory purposes, the example process 500 is described herein with reference to the example PLD 100. Note that one or more operations may be combined, omitted, and/or performed in a different order as desired.

At block 502, configuration data is generated. For example, the configuration data may be generated by the external system 130 based on a desired user configuration/design of the PLD 100. At block 504, the generated configuration data is stored in non-volatile memory (e.g., flash memory). The non-volatile memory may be in the PLD 100 and/or external to the PLD 100 (e.g., external hard drive, external flash drive). At block 506, the configuration data is loaded from the non-volatile memory into volatile memory of the PLD 100. For example, the configuration data may be provided as a configuration bitstream to data lines (e.g., 334, 336) to be written in the memory cells (e.g., SRAM cells).

At block 508, error detection may be initiated on the PLD 100. In an embodiment, an error detection circuit built in the PLD 100 (e.g., as a BIST system) and/or an external error detection circuit (e.g., of the system 130) coupled to the PLD 100 may provide an instruction to the PLD 100 to initiate the error detection. In this regard, the PLD 100 may initiate deterministic read back in response to the error detection.

At block 510, when the enable bit is asserted, the distributed RAM cells of the PLD 100 may be written while performing the error detection. In this regard, user data may be written to the distributed RAM cells concurrently with the various operations shown in FIG. 5.

At block 512, initial values for the ASR (e.g., 304, 604), distributed RAM enable bit register (e.g., 354), and/or distributed RAM status bit register (e.g., 360) are set. For example, the registers 354 and 360 may be set to a Q state of 0. At block 514, a next column is selected by the ASR. For example, the ASR may assert a first column of the array via an address line (e.g., 320A in FIG. 3A, 620H in FIG. 3B). At block 516, the data bit values from the memory cells of the currently selected column are obtained (e.g., read out, read back). In this regard, the sense amplifiers (e.g., 338) of the read/write circuit (e.g., 306, 606) may obtain/determine the data bit value stored in the memory cells based on signals on the bitlines.

At block 518, a determination is made as to whether the currently asserted column is an enable bit column. In some cases, the determination may be made by the ASR and/or logic/memory coupled to the ASR. For example, the ASR may have memory that stores boundaries (e.g., column numbers/addresses) associated with the different types of columns, such as enable bit column, configuration memory column, and potential distributed RAM column.

When the currently selected column is the enable bit column, the enable bit register is set at block 520. The value/state of the enable bit stored in the enable bit memory cell is stored in the enable bit register. At block 522, the data bit values from the memory cells of the currently selected column are passed (e.g., read out, read back) onto respective data lines and provided as read back values (e.g., for error detection). In this regard, the enable bit is the read back value for the enable bit memory cell. The process 500 proceeds to block 536.

When the currently selected column is not the enable bit column, the process 500 proceeds to block 524. At block 524, a determination is made as to whether the currently asserted column is a potential distributed RAM column. When the currently selected column is not a potential distributed RAM column, the data bit values from the memory cells of the currently selected column are passed onto respective data lines and provided as read back values at block 522. The process 500 proceeds to block 536.

When the currently selected column is a potential distributed RAM column, a determination is made as to whether the enable bit register is set to an asserted state (e.g., logic high) at block 526. When the enable bit register is determined to be set in the asserted state, the bitlines of the currently selected column that are associated with distributed RAM are pre-charged at block 528. The pre-charging may occur during read back. The pre-charging of the bitlines may facilitate simultaneous read back and write to the distributed RAM cells.

At block 530, a predetermined value is provided (e.g., passed, read out, read back) as a read back value on the data lines for the memory cells of the currently selected column (e.g., for error detection). The predetermined value is independent of the data bit values stored in these memory cells. With reference to the example of FIG. 3A, assertion of a potential distributed RAM column causes assertion of the line 332 and causes various circuitry (e.g., 344, 350, 352, 354, 356, 358, 360, 362) to operate to cause the predetermined value (e.g., 0 in FIG. 3A) to be provided on the data lines in place of the data bit values stored in the memory cells. Similarly, with reference to the example of FIG. 3B, assertion of a potential distributed RAM column causes assertion of the line 332 and causes various circuitry (e.g., 344, 354, 607, 609, 611, 613) to operate to cause the predetermined value (e.g., 0 in FIG. 3B) to be provided on the data lines in place of the data bit values stored in the memory cells.

At block 532, a determination is made as to whether all potential distributed RAM columns have been selected (e.g., asserted) by the ASR. When all the potential distributed RAM columns have been selected by the ASR, the enable bit register is reset at block 534. In this regard, the enable bit register is reset to the unasserted state (e.g., zeroed out). The process 500 proceeds to block 536. When not all the potential distributed RAM columns have been selected by the ASR, the process 500 proceeds to block 536.

At block 536, a determination is made as to whether all columns of the programmable logic block have been selected by the ASR. When not all columns of the programmable logic block have been selected by the ASR, a next column of the programmable logic block is selected by the ASR at block 514.

When all columns of the programmable logic block have been selected by the ASR, the various blocks (e.g., 510, 512, 514, 516, 518, and so forth) are repeated for remaining memory cells at block 538. The remaining memory cells may include memory cells of other programmable logic blocks and/or other remaining memory cells that include configuration data. In an embodiment, each remaining programmable logic block may have an enable bit column, configuration memory columns, and potential distributed RAM columns. Other remaining memory cells may be used to define/configure components of the PLD other than the programmable logic blocks. For example, the remaining memory cells may include configuration data that define/configure functionality provided by SERDES blocks (e.g., 150), PCS blocks (e.g., 152), routing resources (e.g., 180), and/or other components of the PLD.

At block 540, the configuration data (e.g., original configuration data) in the non-volatile memory can be compared with values obtained (e.g., passed, read out, read back) from the memory cells. For example, in the process 500, the values obtained from the memory cells include the memory cells of the programmable logic blocks and any remaining memory cells. In an embodiment, a CRC checksum calculated based on the configuration data in the non-volatile memory can be compared with a CRC checksum calculated based on the values obtained from the memory cells.

At block 542, a determination is made as to whether there is an error in the configuration data of the PLD. For example, a mismatch in the CRC checksum calculated based on the configuration data in the non-volatile memory and the CRC checksum calculated based on the values obtained from the memory cells may be indicative of an error in the configuration data of the PLD. In an embodiment, when an error is determined to have occurred, the original configuration data may be reloaded into the PLD 100 to reconfigure (e.g., reprogram) the PLD 100.

Although the flow diagram of FIG. 5 has been discussed in the context of a full SED readout of PLD 100, other embodiments are contemplated. For example, readout and correction may be performed on a column-by-column basis. In this regard, single columns of memory cells may be read out and corrected without requiring a full SED readout of the entire PLD 100 to be performed. As a result, selected portions of memory may be checked for errors and corrected, thus saving significant downtime associated with error checking and correction. In addition, various types of error checking techniques are contemplated including, for example, CRC checks, parity checks, and/or others as appropriate.

In view of the present disclosure, it will be appreciated that improved techniques for deterministic readout of distributed RAM are provided. As discussed, in conventional implementations, dedicated address blocking circuits must be provided for every potential distributed RAM memory cell. Indeed, as also discussed, such conventional techniques can increase the overall transistor count for each potential distributed RAM memory cell by at least 50%.

In contrast, the register-based approaches of the present disclosure permit deterministic read back to be performed for an entire row and/or multiple rows without additional transistors having to be added to the individual memory cells to support such deterministic read back. In this regard, one or more appropriate registers and logic may be provided in a row-based implementation to selectively read out deterministic data values for potential distributed RAM memory cells, thus providing savings in power, chip area, and materials cost.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

The invention claimed is:

1. A programmable logic device (PLD) comprising:
a configuration memory comprising an array of memory cells arranged in rows and columns, wherein at least one of the rows comprises an enable bit, a first set of memory cells configured to store configuration data to configure the PLD for operation, and a second set of memory cells selectively configurable to store additional configuration data or non-configuration data as identified by a value of the enable bit;
an address logic circuit configured to selectively assert the columns of the array by respective address lines;
a first register configured to store the value of the enable bit in response to an assertion by the address logic circuit of an address line corresponding to the enable bit; and
a read back circuit configured to selectively provide, for each memory cell, a data bit value stored by the memory cell or a predetermined data bit value based at least on the stored value of the first register, wherein the read back circuit is configured to provide the predetermined data bit value for the second set of memory cells comprising the non-configuration data.

2. The PLD of claim 1, further comprising:
a second register configured to identify whether each memory cell accessed by the read back circuit comprises the non-configuration, data; and
wherein the read back circuit is configured to selectively provide the data bit value or the predetermined data bit value further based on a value stored by the second register.

3. The PLD of claim 2, wherein the stored value of the second register is set in response to the stored value of the first register value and an assertion by the address logic circuit of one of the address lines corresponding to the second set of memory cells.

4. The PLD of claim 2, further comprising:
a first logic circuit configured to pass the enable bit value from the read back circuit to the first register; and
a second logic circuit configured to pass the enable bit value from the first register to the second register.

5. The PLD of claim 2, wherein the address logic circuit is configured to reset the stored value of the second register after all address lines associated with the second set of memory cells have been asserted.

6. The PLD of claim 1, further comprising:
a write circuit configured to write the non-configuration data to at least one of the second set of memory cells of the at least one row while the read back circuit simultaneously provides the predetermined data bit value for at least one of the memory cells of the row; and
a charging circuit configured to pre-charge bitlines associated with the row during read back.

7. The PLD of claim 1, wherein the configuration data identifies at least one logic operation of at least one look-up table (LUT) of the PLD.

8. The PLD of claim 1, wherein the address logic circuit comprises an address shift register.

9. The PLD of claim 1, further comprising an output port configured to pass the data bit values provided by the read back circuit to an external system for error detection processing.

10. A method comprising:
selectively asserting, by an address logic circuit, columns of an array of memory cells of a programmable logic device (PLD) by respective address lines, wherein the array of memory cells is arranged in rows and the columns, and wherein at least one of the rows comprises an enable bit, a first set of memory cells configured to store configuration data to configure the PLD for operation, and a second set of memory cells selectively configurable to store additional configuration data or non-configuration data as identified by a value of the enable bit;
storing, in a first register, the value of the enable bit in response to the asserting of one of the address lines corresponding to the enable bit; and
selectively providing, by a read back circuit, for each memory cell, a data bit value stored by the memory cell or a predetermined data bit value based at least on the stored value of the first register, wherein the selectively providing comprises providing the predetermined data bit value for the second set of memory cells comprising the non-configuration data.

11. The method of claim 10, further comprising:
identifying, by a second register, whether each memory cell accessed by the read back circuit comprises the non-configuration data; and
wherein the selectively providing is further based on a value stored by the second register.

12. The method of claim 11, further comprising setting the stored value of the second register in response to the stored value of the first register value and the asserting of one of the address lines corresponding to the second set of memory cells.

13. The method of claim 11, further comprising:
passing, by a first logic circuit, the enable bit value from the read back circuit to the first register; and
passing, by a second logic circuit, the enable bit value from the first register to the second register.

14. The method of claim 11, further comprising:
resetting, by the address logic circuit, the stored value of the second register after all address lines associated with the second set of memory cells have been asserted.

15. The method of claim 10, further comprising:
writing the non-configuration data to at least one of the second set of memory cells of the at least one row while the read back circuit simultaneously provides the pre-determined data bit value for at least one of the memory cells of the row; and
pre-charging bitlines associated with the at least one row during read back.

16. The method of claim 10, wherein the configuration data identifies at least one logic operation of at least one look-up table (LUT) of the PLD.

17. The method of claim 10, wherein the address logic circuit comprises an address shift register.

18. The method of claim 10, further comprising:
passing the data bit values provided by the read back circuit to an external system for error detection processing.

* * * * *